(12) United States Patent
Morrow et al.

(10) Patent No.: US 10,886,217 B2
(45) Date of Patent: Jan. 5, 2021

(54) INTEGRATED CIRCUIT DEVICE WITH BACK-SIDE INTERCONNECTION TO DEEP SOURCE/DRAIN SEMICONDUCTOR

(71) Applicant: Intel Corporation, Santa Clara, CA (US)

(72) Inventors: Patrick Morrow, Portland, OR (US); Mauro J. Kobrinsky, Portland, OR (US); Mark T. Bohr, Aloha, OR (US); Tahir Ghani, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 16/348,116

(22) PCT Filed: Dec. 23, 2016

(86) PCT No.: PCT/US2016/068564
§ 371 (c)(1),
(2) Date: May 7, 2019

(87) PCT Pub. No.: WO2018/106267
PCT Pub. Date: Jun. 14, 2018

(65) Prior Publication Data
US 2019/0259699 A1   Aug. 22, 2019

Related U.S. Application Data

(63) Continuation of application No. PCT/US2016/065423, filed on Dec. 7, 2016.

(51) Int. Cl.
*H01L 21/8234* (2006.01)
*H01L 29/66* (2006.01)
(Continued)

(52) U.S. Cl.
CPC .......... *H01L 23/528* (2013.01); *G06F 30/392* (2020.01); *G06F 30/394* (2020.01);
(Continued)

(58) Field of Classification Search
CPC . H01L 23/528; H01L 29/4175; H01L 23/522; H01L 21/768; H01L 21/823475;
(Continued)

(56) References Cited

U.S. PATENT DOCUMENTS

| 5,869,867 A | 2/1999 | Takeuchi |
| 7,402,866 B2 | 7/2008 | Liang et al. |

(Continued)

FOREIGN PATENT DOCUMENTS

| JP | H09260669 | 3/1997 |
| KR | 1020100106702 | 10/2010 |

OTHER PUBLICATIONS

International Search Report & Written Opinion dated Aug. 28, 2017 for PCT Patent Application No. PCT/US2016/068564.
(Continued)

*Primary Examiner* — Nelson Garces
(74) *Attorney, Agent, or Firm* — Green, Howard & Mughal LLP

(57) ABSTRACT

Transistor cell architectures including both front-side and back-side structures. A transistor may include one or more semiconductor fins with a gate stack disposed along a sidewall of a channel portion of the fin. One or more source/drain regions of the fin are etched to form recesses with a depth below the channel region. The recesses may extend through the entire fin height. Source/drain semiconductor is then deposited within the recess, coupling the channel region to a deep source/drain. A back-side of the transistor is processed to reveal the deep source/drain semiconductor material. One or more back-side interconnect
(Continued)

metallization levels may couple to the deep source/drain of the transistor.

20 Claims, 16 Drawing Sheets

(51) Int. Cl.
*H01L 29/78* (2006.01)
*H01L 23/528* (2006.01)
*H01L 21/306* (2006.01)
*H01L 27/02* (2006.01)
*H01L 27/088* (2006.01)
*H01L 29/08* (2006.01)
*H01L 29/10* (2006.01)
*H01L 29/40* (2006.01)
*H01L 21/768* (2006.01)
*H01L 29/417* (2006.01)
*H01L 29/772* (2006.01)
*H01L 23/522* (2006.01)
*G06F 30/392* (2020.01)
*G06F 30/394* (2020.01)

(52) U.S. Cl.
CPC ...... *H01L 21/30604* (2013.01); *H01L 21/768* (2013.01); *H01L 21/76898* (2013.01); *H01L 21/823418* (2013.01); *H01L 21/823431* (2013.01); *H01L 21/823475* (2013.01); *H01L 23/522* (2013.01); *H01L 27/0207* (2013.01); *H01L 27/088* (2013.01); *H01L 27/0886* (2013.01); *H01L 29/0847* (2013.01); *H01L 29/1095* (2013.01); *H01L 29/401* (2013.01); *H01L 29/4175* (2013.01); *H01L 29/41791* (2013.01); *H01L 29/66636* (2013.01); *H01L 29/66795* (2013.01); *H01L 29/772* (2013.01); *H01L 29/785* (2013.01); *H01L 29/7851* (2013.01)

(58) Field of Classification Search
CPC ....... H01L 29/66636; H01L 21/823431; H01L 21/823821; H01L 21/845; H01L 27/0886; H01L 27/094; H01L 27/10826; H01L 27/10879; H01L 27/1211; H01L 29/41791; H01L 29/66795; H01L 29/785; H01L 21/823418; G06F 30/392; G06F 30/394

See application file for complete search history.

(56) References Cited

U.S. PATENT DOCUMENTS

| | | | |
|---|---|---|---|
| 9,305,834 | B1 | 4/2016 | Latypov et al. |
| 9,818,856 | B2 | 11/2017 | Hoshi et al. |
| 9,929,133 | B2 | 3/2018 | Lin et al. |
| 2001/0041407 | A1 | 11/2001 | Brown |
| 2004/0119165 | A1 | 6/2004 | Baukus et al. |
| 2006/0115943 | A1 | 6/2006 | Koyanagi |
| 2007/0001219 | A1 | 1/2007 | Radosavljevic et al. |
| 2007/0296002 | A1 | 12/2007 | Liang et al. |
| 2008/0179678 | A1 | 7/2008 | Dyer et al. |
| 2009/0166677 | A1 | 7/2009 | Shibata et al. |
| 2011/0241073 | A1 | 10/2011 | Cohen et al. |
| 2011/0278676 | A1* | 11/2011 | Cheng ................ H01L 27/0924 257/369 |
| 2012/0088339 | A1 | 4/2012 | Molin et al. |
| 2013/0130479 | A1 | 5/2013 | Stuber et al. |
| 2013/0162346 | A1 | 6/2013 | McElvain et al. |
| 2013/0334576 | A1 | 12/2013 | Park et al. |
| 2014/0054685 | A1 | 2/2014 | Consentino et al. |
| 2014/0231874 | A1 | 8/2014 | Hoshi et al. |
| 2014/0264632 | A1 | 9/2014 | Richter et al. |
| 2014/0332749 | A1 | 11/2014 | Yokoyama |
| 2015/0061026 | A1 | 3/2015 | Lin et al. |
| 2015/0069520 | A1 | 3/2015 | Lee |
| 2015/0137224 | A1 | 5/2015 | Meiser et al. |
| 2015/0137307 | A1* | 5/2015 | Stuber ................ H01L 23/552 257/503 |
| 2015/0206936 | A1 | 7/2015 | Huang |
| 2015/0347659 | A1 | 12/2015 | Chiang et al. |
| 2015/0357425 | A1 | 12/2015 | Liu et al. |
| 2015/0380305 | A1 | 12/2015 | Basker et al. |
| 2016/0043083 | A1 | 2/2016 | Kawa et al. |
| 2016/0093629 | A1 | 3/2016 | Wang |
| 2016/0197069 | A1 | 7/2016 | Morrow et al. |
| 2016/0307996 | A1 | 10/2016 | Meiser et al. |
| 2017/0373064 | A1* | 12/2017 | Chang ................ H01L 29/7853 |

OTHER PUBLICATIONS

International Preliminary Report on Patentability dated Jun. 11, 2019 for PCT Patent Application No. PCT/US2016/068564.

* cited by examiner

INTEGRATED CIRCUIT DEVICE WITH BACK-SIDE INTERCONNECTION TO DEEP SOURCE/DRAIN SEMICONDUCTOR

CLAIM OF PRIORITY

This Application is a National Stage Entry of, and claims priority to, PCT Application No. PCT/US16/68564, filed on 23 Dec. 2016 and titled "INTEGRATED CIRCUIT DEVICE WITH BACK-SIDE INTERCONNECTION TO DEEP SOURCE/DRAIN SEMICONDUCTOR", which is incorporated by reference in its entirety for all purposes.

PRIORITY

This application claims priority to PCT Patent Application No. PCT/US16/65423, filed on 7 Dec. 2016, titled "INTEGRATED CIRCUIT DEVICE WITH CRENELLATED METAL TRACE LAYOUT", and which is incorporated by reference in entirety.

BACKGROUND

Transistor density in integrated circuits (ICs) has increased for decades in conformance with Moore's law. However, as the lateral dimensions of a transistor structure shrink with each technology generation, it becomes increasingly difficult to further reduce structural dimensions.

Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of a chip may be inactive substrate material. A stack of such chips may employ through-substrate via (TSV) technology as a means of vertically interconnecting the chip stack. A TSV typically extends through 20-50 μm, or more, of substrate material and therefore is generally limited to via diameters on the micron-scale. As such, TSV density is limited to far below the density of most device (e.g., transistor, memory) cells. Also, the final z-height of a chip-stack employing TSV technology may be hundreds of microns thicker than the actual device layers employed by the stacked device.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
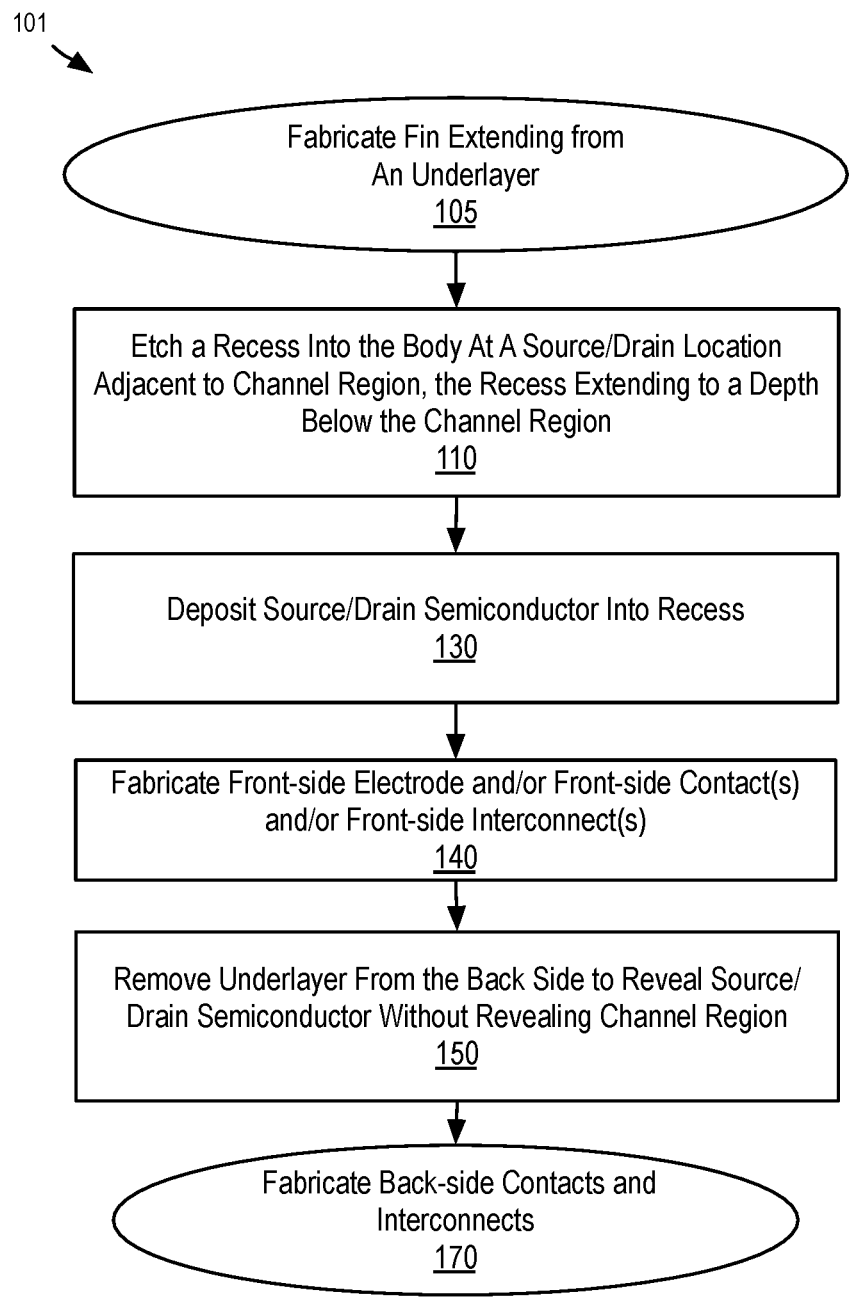
FIG. 1 is a flow diagram illustrating deep source semiconductor and back-side interconnect fabrication methods, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

IC device structures and fabrication techniques employing a reveal of a back side of device structures are described herein. In some exemplary embodiments, the reveal of the back side, referred to herein as a "back-side reveal" or simply "BSR", of a device structure may entail wafer-level back-side processing. In contrast to a conventional TSV-type technology, a back-side reveal as described herein may be performed at the density of transistor cells, and even within sub-regions of a transistor cell. Furthermore, such back-side reveals may be performed to remove substantially all of a donor substrate upon which a device layer was disposed during front-side device processing. As such, a microns-deep TSV becomes unnecessary with the thickness of semiconductor in the device cells following back-side reveal potentially being only tens or hundreds of nanometers.

The back-side reveal techniques described herein may enable a paradigm shift from "bottom-up" device fabrication to "center-out" fabrication, where the "center" is any layer that is employed in front-side fabrication, revealed from the back side, and again employed in back-side fabrication. As should become clear from the following discussion, processing of both a front side and revealed back side of a device structure may address many of the challenges associated with fabricating 3D ICs when primarily relying on front-side processing.

FIG. 1 is a flow diagram illustrating deep source/drain semiconductor and back-side interconnect fabrication methods 101, in accordance with some embodiments. Methods 101 may be applied to fabricate transistor cells that may be replicated in parallel over the surface area of a substrate. Each transistor cell may include a transistor, such as, but not limited to, field effect transistors (FETs), including metal-oxide-semiconductor FETs (MOSFETs). Methods 101 are applicable to both planar and non-planar FETs. Non-planar FETs have semiconductor channel regions that include a sidewall through which a gate is electrically (e.g., capacitively) coupled. Exemplary non-planar transistors include multi-gate FinFETs, such as double-gate and tri-gate transistors, as well as wrap-around (gate all-around) transistors, such as nanoribbon or nanowire transistors.

Methods 101 fabricate transistor cell architectures including both front-side and back-side structures. According to these architectures, a transistor may include one or more semiconductor bodies with a gate stack disposed along a sidewall of a channel portion of the bodies. One or more source/drain regions of the bodies are etched to form recesses that have a depth below the channel region. These recesses may extend through the entire semiconductor body height. Source/drain semiconductor is then deposited within the recess, coupling the channel region to a deep source/drain. Following front-side processing, a back-side of the transistor is processed to reveal the deep source/drain semiconductor material. One or more back-side interconnect metallization levels may then be fabricated to couple to the deep source/drain of the transistor. In some examples, where the transistor architecture includes only one deep source/drain, a second source/drain is shallow (e.g., having a depth approximately equal to that of the channel region). A back-side power supply line may then couple to the deep source/drain terminal (e.g., source), while a front-side signal line couples to the shallow source/drain terminal (e.g., drain). With relocation of at least one transistor terminal routing to the back-side of the transistor cell, interconnection of the transistor terminals becomes 3D allowing for additional lateral scaling beyond conventional architectures employing single-sided transistor interconnection.

Methods 101 begin with fabricating one or more semiconductor bodies extending from an underlayer at operation 105. Each semiconductor body may have a non-planar structure with sidewalls, such as, but not limited to, a fin having a longitudinal length greater than it's transverse width. In some exemplary embodiments, the semiconductor body is single-crystalline, but may also be poly(nano)-crystalline, or amorphous in some thin-film transistor implementations. A semiconductor body may have any semiconductor composition, such as, but not limited to, group IV materials (e.g., silicon, germanium, carbon, and alloys thereof), group III-V alloys (e.g., indium gallium arsenide, indium phosphide, gallium arsenide, indium antimonide, indium arsenide, etc.), group III-N alloys (e.g., gallium nitride, aluminum gallium nitride, indium gallium nitride, etc.), and oxide semiconductors (e.g., indium gallium zinc oxide, zinc oxide, tin oxide, etc.). The underlayer from which each semiconductor body extends may be of any composition as a function of processing upstream of methods 101, and embodiments herein are not limited in this respect. In some examples, the underlayer is the same semiconductor material as that of the non-planar body, with the non-planar body having been etched from an uppermost portion of the underlayer. For example, the underlayer may be a bulk semiconductor wafer, such as a 300 mm or 450 mm diameter silicon wafer. In other embodiments, the underlayer is an insulative dielectric layer, such as that found in a semiconductor on insulator (SOI) substrate. For such embodiments, the semiconductor bodies may have been etched into the semiconductor layer disposed over the insulator layer.

Methods 101 continue at operation 110 where a recess is etched into a semiconductor body at a source/drain location adjacent to a channel region. This recess may extend through the transverse width of the semiconductor body, for example cutting through a fin, and extend to a depth below the channel region. The recess is referred to herein as a "deep" recess because it reaches a depth below the channel region. In some embodiments, the deep recess extends all the way through the height of the semiconductor body, intersecting the underlayer. At operation 130, source/drain semiconductor material is deposited into the recess formed at operation 110. The source/drain semiconductor may be impurity-doped material, or an otherwise alloyed material having the desired conductivity type (e.g., p-type or n-type). The source/drain semiconductor material may be deposited on at least a sidewall of the semiconductor body exposed by the recess etch, extending from a bottom of the recess, proximal the underlayer, to the top of the body, proximal to the channel region. As such, the source/drain semiconductor deposited at operation 130 may be considered a "through-fin" or "through stratum" source/drain semiconductor material that extends between a front-side of the semiconductor body and the underlayer. The source/drain material may also completely backfill the recess to form a source/drain semiconductor plug having a transverse width equal to (or greater than) that of the semiconductor body.

Methods 101 continue at operation 140 where front-side processing is employed to fabricate a gate electrode and/or one or more other terminal contacts that are further interconnected with terminals of other transistors through one or more front-side interconnect metallization levels built up over the front-side of the semiconductor bodies. Any known terminal contacts, interconnect metallization levels, and inter-layer dielectric architectures may be utilized at operation 140, as embodiments herein are not limited in this respect.

At operation 150, back-side processing is employed to reveal the source/drain semiconductor deposited within the deep recess. Because of the difference in depth of source/drain semiconductor and channel region, such back-side processing may expose the source/drain semiconductor without revealing the channel region or other similarly shallow features, such as the gate electrode or other transistor terminals. The back-side processing may, for example, include chemical mechanical polishing (CMP) of the underlayer, or selective patterning of the underlayer to reveal the deep source/drain. Following the reveal, methods 101 conclude at operation 170 where a back-side contact to the deep source/drain material is fabricated. One or more back-side interconnect metallization level interconnecting the deep source/drain material of one transistor cells to that other transistor cells may also be fabricated as part of operation 170. Methods 101 may thereby achieve transistor-level 3D interconnection by way of the through-stratum, p-type or n-type, source/drain semiconductor material.

Figure 2:
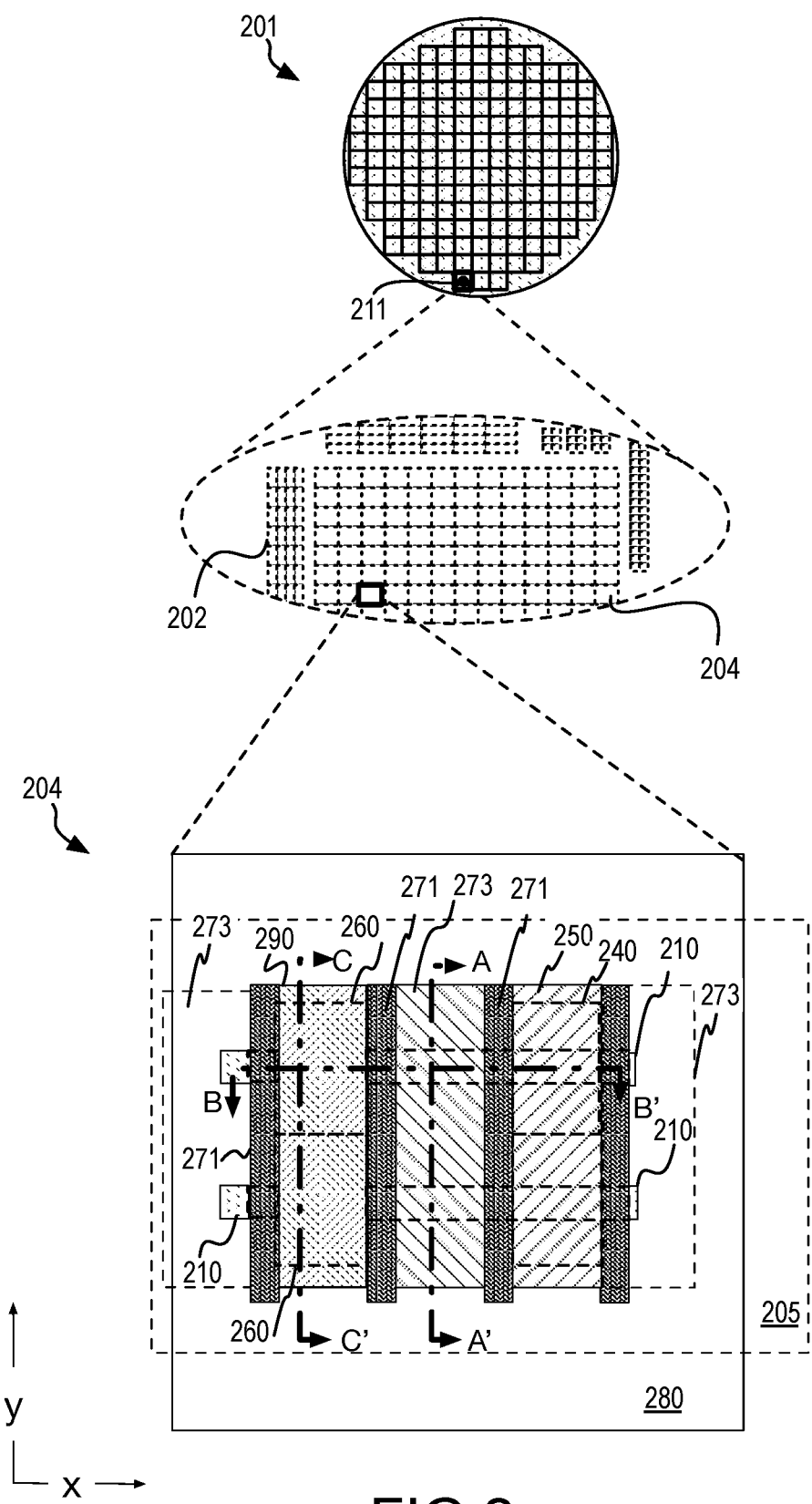
FIG. 2 is a plan view of a substrate with expanded views of IC die on the substrate, and of a transistor cell on the IC die fabricated with deep source/drain semiconductor and back-side interconnects, in accordance with some embodiments.

Methods 101 may be practiced with a wide variety of techniques to achieve various cell architectures. FIG. 2 is a plan view of a substrate 201 with expanded views of IC die 211, and of a logic transistor cell 204 fabricated with deep source/drain semiconductor and back-side interconnects, in accordance with some embodiments of the methods 101. In FIG. 2, a plurality of logic transistor cells 204 are arrayed over an area of a device layer within IC die 211. Additional device cells 202 may be, for example, any of memory cells, power transistor cells, RF transistor cells, optical device cells, or the like. Transistor cell 204 includes a field effect FET with a source terminal, a drain terminal, and a gate terminal, in accordance with one illustrative embodiment. In some embodiments, the source and drain terminals include semiconductor having the same conductivity type. In other embodiments, the source and drain terminals include semiconductor having complementary conductivity types (e.g., as employed in a tunnel FET, or TFET). The FET may also include a heterojunction (i.e., HFET) and may also qualify as a high electron mobility transistor (HEMT), for example where the channel region comprises a III-V or III-N material. In FIG. 2, solid lines within the expanded view of transistor cell 204 denote salient materials and/or features overlying other material or structural features denoted in dashed lines within the transistor cell stratum. Heavy dot-dashed lines in FIG. 2 denote planes A-A', B-B' and C-C' along which cross-sectional views are further provided in FIGS. 4A, B, C through 13A, B, C, where the letter in the figure number corresponds to the cross-sectional plane designated by that same letter.

As further shown in FIG. 2, FET cell 204 is supported by an underlayer 205 with semiconductor bodies 210 that are embedded within a field isolation dielectric material 280. In some embodiments, underlayer 205 includes a carrier substrate. In some embodiments, an intervening layer (not depicted) separates underlayer 205 from a carrier substrate. Transistor cell 204 includes a gate electrode 273 strapping over a channel region of each of a first and a second semiconductor body 210. Although two semiconductor bodies 210 are illustrated in FIG. 2, a non-planar FET may include one or more such semiconductor bodies. The transistor channel region within semiconductor bodies 210 may include one or more semiconductor region having any of the compositions described above that are suitable for a field effect transistor. Exemplary materials include, but are not limited to, group IV semiconductors (e.g., Si, Ge, SiGe), group III-V semiconductors (e.g., GaAs, InGaAs, InAs, InP), group III-N semiconductors (e.g., GaN, AlGaN, InGaN), oxide semiconductors, transition metal dichalcogenides (TMDCs), graphene, etc. In some advantageous embodiments, semiconductor bodies 210 are monocrystalline, but they may also be poly(nano)-crystalline or amorphous, with some examples being oxide semiconductors and other thin film transistor semiconductor.

Although only one gate electrode 273 is illustrated in solid line as being part of a single logic transistor cell, an exemplary second gate electrode 273 is drawn in dashed line as being associated with an adjacent cell. The second gate electrode is also laterally separated from metallization 250 and/or source/drain semiconductor 240 by spacer dielectric 271. While any gate stack materials known to be suitable for semiconductor bodies 210 may be utilized, in some exemplary embodiments the gate stack includes a high-k dielectric material (with a bulk relative permittivity greater than 9) and a metal gate electrode having a work function suitable for semiconductor bodies 210. Exemplary high-k materials include metal oxides, such as, but not limited to, $Al_2O_3$, $HfO_2$, and $HfAlO_x$. Silicates, such as, but not limited to $HfSiO_x$, or $TaSiO_x$ may also be suitable for some semiconductor body compositions (e.g., Si, Ge, SiGe, III-V). Gate electrode 273 may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in gate electrode 273, such as, but not limited to, C, Ta, W, Pt, and Sn.

As further illustrated in FIG. 2, source/drain metallization 250 is disposed adjacent to gate electrode 273 and also extends across semiconductor bodies 210. In the illustrated embodiment, source/drain metallization 250 is disposed on a shallow source/drain semiconductor 240, which is further disposed on semiconductor bodies 210. Shallow source/drain semiconductor 240 may have n-type or p-type conductivity. Semiconductor bodies 210 are shown in dashed line as extending under an electrically insulating spacer dielectric 271 and intersecting deep source/drain semiconductor 260. Semiconductor bodies 210 are bifurcated by deep source/drain semiconductor 260. Deep source/drain semiconductor 260 may have n-type or p-type conductivity. For some exemplary embodiments, both shallow source/drain semiconductor 240 and deep source/drain semiconductor 260 have the same conductivity type (e.g., n-type for NMOS and p-type for PMOS). In alternative embodiments (e.g., for a tunneling FET), shallow source/drain semiconductor 240 has conductivity complementary to that of deep source/drain semiconductor 260 (e.g., n-type source and p-type drain of a TFET). Shallow and deep source/drain semiconductor 240, 260 may be any semiconductor materials compatible with semiconductor bodies 210, such as, but not limited to, group IV semiconductors (e.g., Si, Ge, SiGe), and/or group III-V semiconductors (e.g., InGaAs, InAs), and/or group III-N semiconductors (e.g., InGaN), and/or oxide semiconductors. In the illustrated embodiment, shallow and deep source/drain semiconductor 240, 260 form continuous stripes extending between semiconductor bodies 210. As a function of spacing between semiconductor bodies 210, shallow source/drain semiconductor 240 and/or deep source/drain semiconductor 260 may each comprise a discrete structure disposed on each semiconductor body 210.

Spacer dielectric 271 laterally separates gate electrode 673 from source/drain metallization 250 and/or source/drain semiconductor 240, 260. Spacer dielectric 271 may be or any dielectric such as, but not limited to, silicon dioxide, silicon nitride, or silicon oxynitride, or any known low-k material having a relative permittivity below 4.0. Source/drain metallization 250 may include one or more metals (e.g., Ti, W, Pt, their alloys, and nitrides) that forms an ohmic or tunneling junction with shallow source/drain semiconductor 240. No source/drain metallization is shown over deep source/drain semiconductor 260, which is a structural feature of embodiments herein that couple deep source/drain semiconductor 260 to back-side metallization (not depicted in FIG. 2). As such, an insulative dielectric 290 extends over deep source/drain 260, enabling overlying metallization layers (not depicted) to extend over deep source/drain 260 without shorting the transistor terminal.

Figure 3:
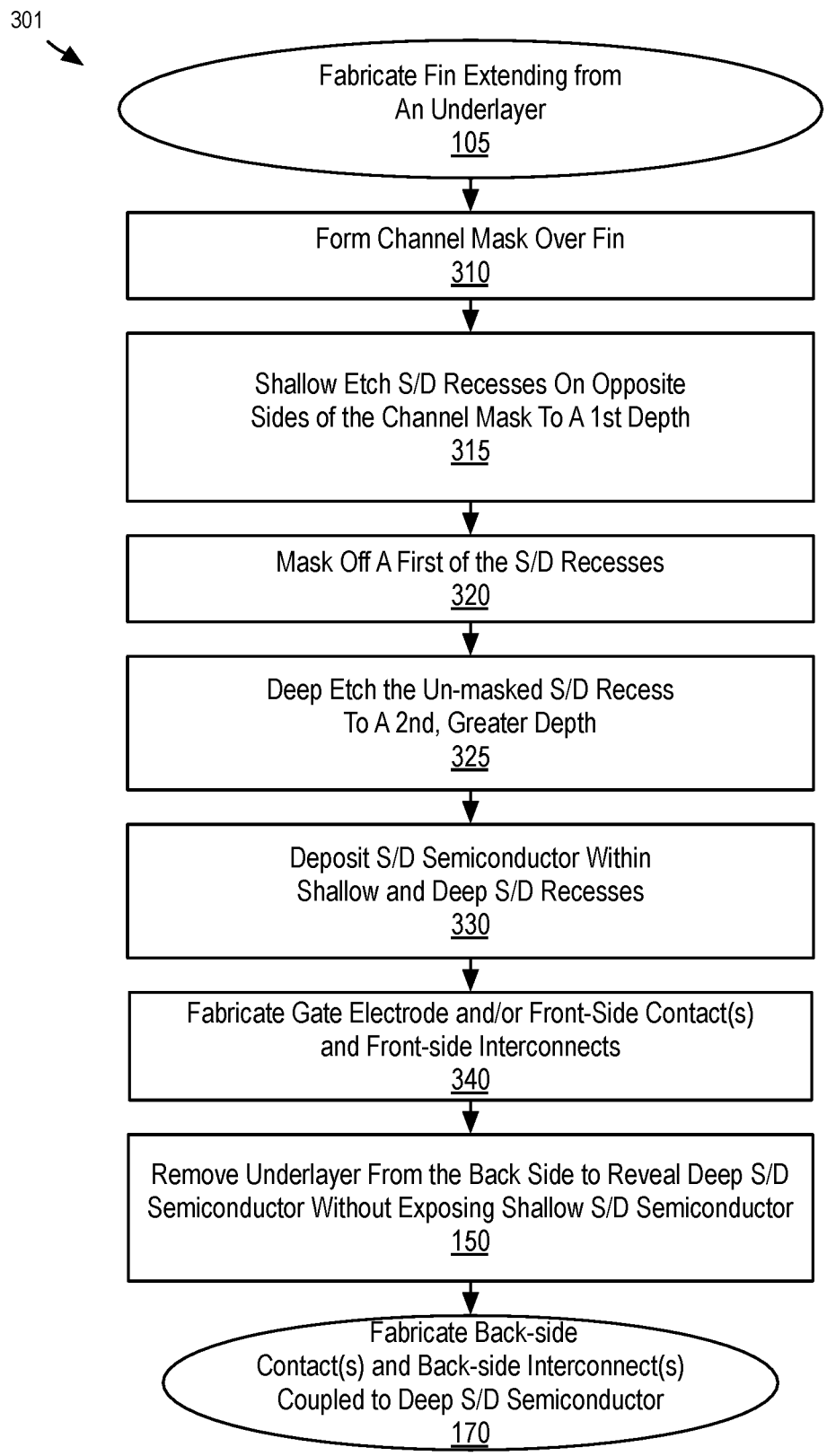
FIG. 3 is a flow diagram further illustrating deep source/drain semiconductor and back-side interconnect fabrication methods, in accordance with some embodiments.

While transistor cell 204 may be fabricated with various methods, methods 301 illustrated in FIG. 3 highlight some advantageous embodiments. Structural features indicative of methods 301 are further illustrated in the cross-sectional views in FIGS. 4A-13C. In reference to FIG. 3, methods 301 begin with operation 105, where a semiconductor body (e.g., fin) is fabricated to extend from an underlayer following any known techniques and having any of the properties described above in the context of FIG. 1. Methods 301 continue at operation 310, where a channel mask is formed over the fin. The channel mask may be sacrificial, for example in the form of a sacrificial gate mandrel that is to be subsequently replaced in a "gate-last" fabrication process. The channel mask may also be non-sacrificial, for example in the form of a permanent gate stack. The channel mask may also include spacer dielectric material that is formed with a self-aligned process to the gate mandrel/gate stack. With the channel mask in place, methods 301 continue to operation 315 where recesses are etched into the semiconductor fin at the source/drain locations on either side of the channel mask. These recesses are etched to a first depth associated with a shallow source/drain recess.

Figure 4A:
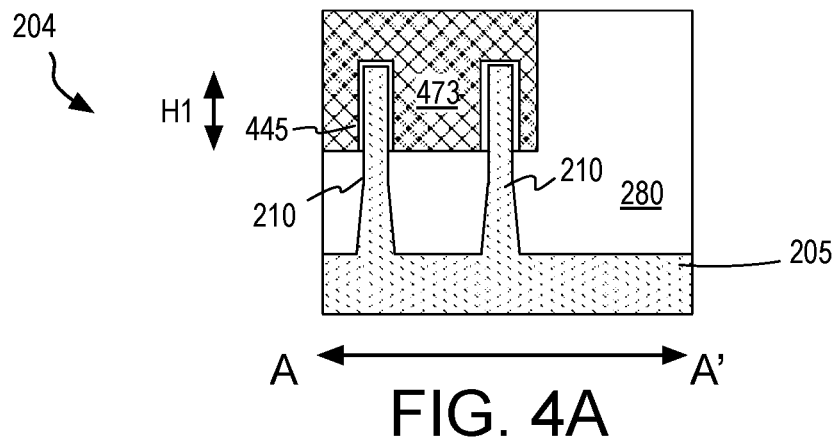
FIGS. 4A-4C, 5A-5C, 6A-6C, 7A-7C, 8A-8C, 9A-9C, 10A-10C, 11A-11C, 12A-12C, and 13A-13C are cross-sectional views of a transistor cell fabricated with deep source/drain semiconductor and back-side interconnects, in accordance with some embodiments of the methods illustrated in FIG. 1 and FIG. 3.
Figure 4B:
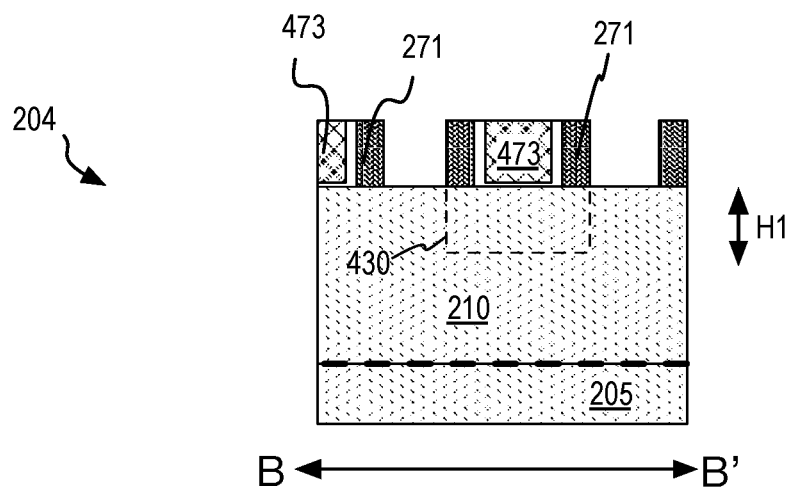
Figure 4C:
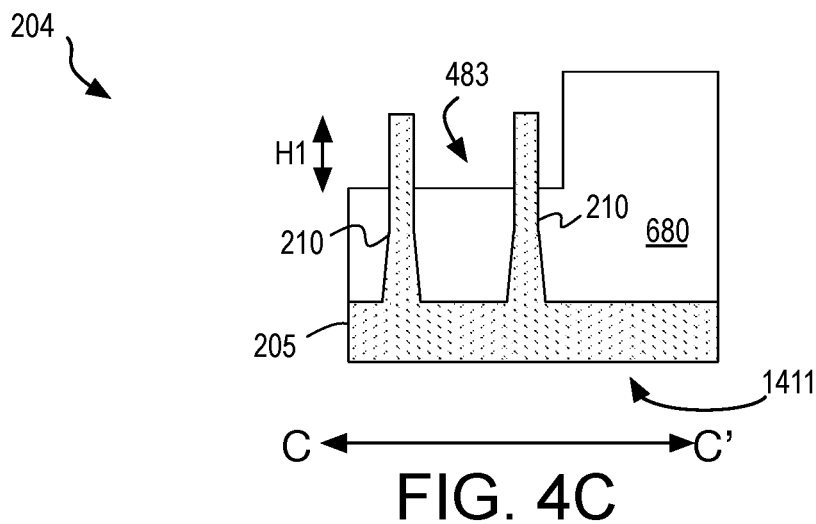

In the exemplary embodiments further illustrated in FIGS. 4A-4C, a channel mask including a sacrificial gate dielectric 445 and sacrificial gate electrode 473 is disposed within a recess surrounded by isolation dielectric 280. Any materials may be employed for sacrificial gate dielectric 445 and sacrificial gate electrode 473. As shown in FIG. 4A, sacrificial gate electrode 473 is disposed over exposed sidewalls of semiconductor bodies 210 defining an active fin height H1. Under sacrificial gate electrode 473, a sub-fin portion of semiconductor bodies 210 remains embedded within isolation dielectric 280. As shown in FIG. 4B, sacrificial gate electrode 473, along with spacer dielectric 271, protects transistor channel region 430 while source/drain locations there between are exposed. As shown in FIG. 4C, in preparation for recessing the exposed portions of semiconductor bodies 210, a dielectric recess 483 is etched into isolation dielectric 280 surrounding the source/drain locations. Isolation dielectric recess 483 may be etched during, or after, fabrication of the channel mask, for example. Like the channel mask, isolation dielectric recess 483 extends laterally between the two semiconductor bodies 210. In the exemplary embodiment shown in FIG. 4C, dielectric recess 483 has a depth sufficient to expose active fin height H1, with the underlying sub-fin portion of semiconductor bodies 210 remaining embedded within isolation dielectric 280.

Figure 5A:
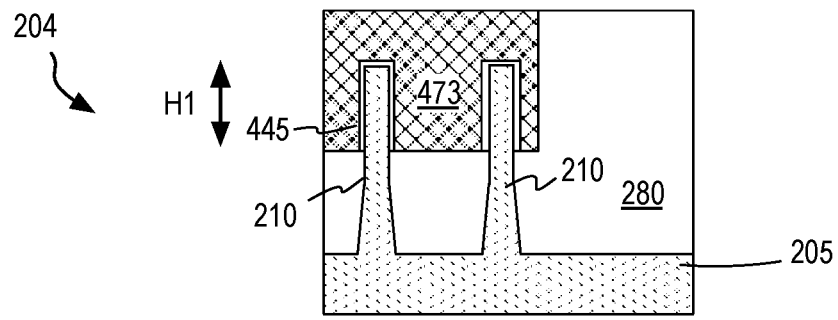
Figure 5B:
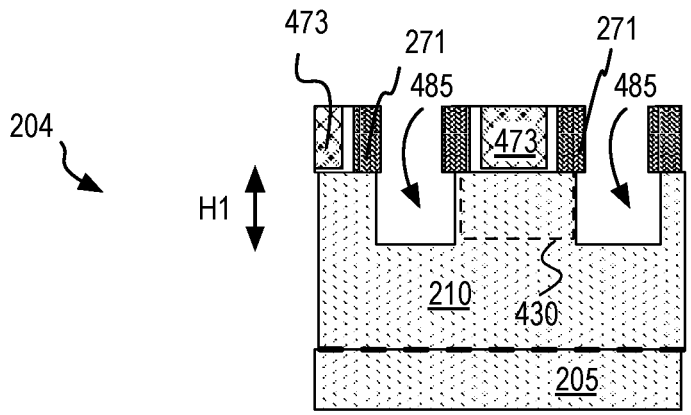
Figure 5C:
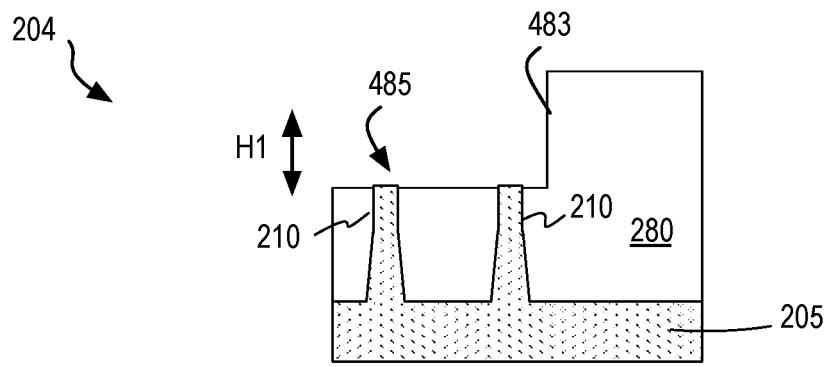

FIGS. 5A-5C further illustrate transistor cell 204 following the shallow source/drain recess etch operation 315. As shown in FIGS. 5A and 5B, the channel region 430 remains protected by the channel mask (e.g., sacrificial gate electrode 473). Spacer dielectric 271 may also protect a portion of channel region 430 while a shallow source/drain recess 485 is etched at the unprotected source/drain locations. As shown in FIG. 5C, shallow source/drain recess 485 has a depth approximately equal to that of active fin height H1 (i.e., approximately equal to the depth of channel region 430). In this exemplary embodiment, source/drain recess 485 has a depth approximately equal to that of isolation dielectric recess 483. Source/drain recess 485 may be performed with any etch process suitable for the composition of semiconductor bodies 210. Because the shallow source/drain recess 485 removes the portion of the fin exposed within the isolation dielectric recess 483, an isotropic etch process may be employed to etch the exposed semiconductor laterally as the fin height H1 may exceed the transverse width of semiconductor bodies 210. An undercut of semiconductor body 210 below spacer dielectric 271 is indicative of such an isotropic semiconductor etch process and may be tuned to achieve a desired channel length between the source/drain locations.

Returning to FIG. 3, methods 301 continue at operation 320 where one of the source/drain locations is protected with a mask, and the semiconductor body is then further recessed at another of the source/drain locations during the deep etch operation 325. Any photoresist or hardmask patterning process may be employed at operations 320. The deep etch operation 325 may recess the semiconductor body below the depth of the channel region. In some advantageous embodiments, the deep etch operation 325 may etch entirely through the semiconductor fin, thereby bifurcating the non-planar semiconductor body at the source/drain location. Any semiconductor etch process may be employed at operation 325. In some embodiments, a selective etch process (wet chemical or plasma-based) may be employed to recess the semiconductor selectively to surrounding isolation dielectric. Alternatively, both the semiconductor and isolation dielectric may be recessed at the source/drain location.

Figure 6A:
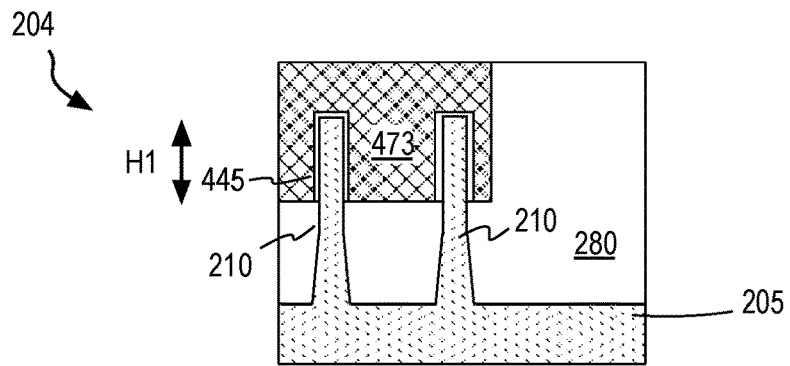
Figure 6B:
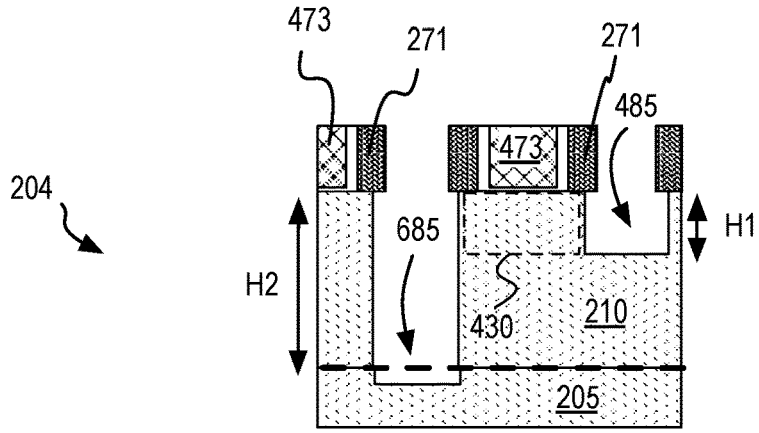
Figure 6C:
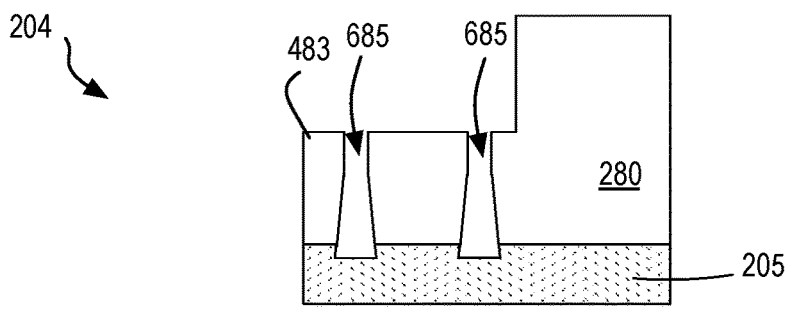

FIGS. 6A-6C further illustrate transistor cell 204 following the deep source/drain recess etch operation 325. As shown in FIGS. 6A and 6B, the channel region 430 remains protected by the channel mask (sacrificial gate electrode 473). Spacer dielectric 271 may also continue to protect a portion of channel region 430. Shallow source/drain recess 485 is protected while deep source/drain recess 685 is formed at the unprotected source/drain location. The deep source/drain etch may be with any wet chemical or dry (plasma) etch process suitable for the composition of semiconductor bodies and recess aspect ratio. As shown in FIGS. 6B and 6C, deep source/drain recess 685 has a depth approximately equal to that of fin height H2 (i.e., substantially deeper the depth of channel region 430), and intersects underlayer 205. For the example shown in FIG. 6C, source/drain recess 685 follows the profile of semiconductor body 210, which is indicative of the deep source/drain etch employing an etch process that is selective to semiconductor bodies 210 over isolation dielectric 280.

Returning to FIG. 3, methods 301 continue at operation 330 where source/drain semiconductor is deposited within the shallow and deep source/drain recesses. The two source/drain recesses may be filled concurrently where the source/drain materials are to be the same (e.g., for an NMOS or PMOS device), or consecutively where the source/drain materials are to be differentiated between the deep and shallow recesses. Depending on the deposition process, the source/drain semiconductor may be amorphous, poly-crystalline, or substantially single-crystalline. The source/drain semiconductor deposition may be by chemical vapor deposition (CVD) and/or epitaxial growth, for example. In an epitaxial growth, the sidewall surfaces of at least the channel region may seed the crystalline growth within both the shallow and deep recesses. The underlying sub-fin sidewall exposed by the deep source/drain etch may further seed crystalline growth within the deep recess. Any semiconductor providing suitable source/drain function may be deposited at operation 330. Depending on deposition conditions and/or the duration of the deposition, the deep and shallow source/drain recesses may be completely backfilled with the source/drain semiconductor material(s), or source/drain semiconductor material may only form on the exposed sidewalls of the semiconductor body protected by the channel mask.

Figure 7A:
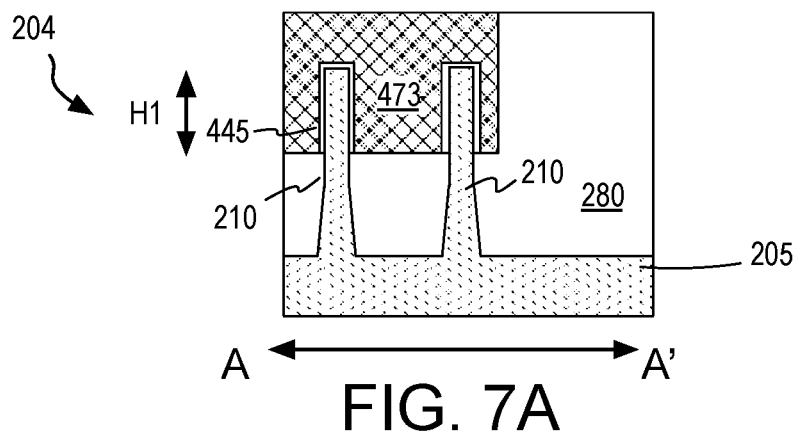
Figure 7B:
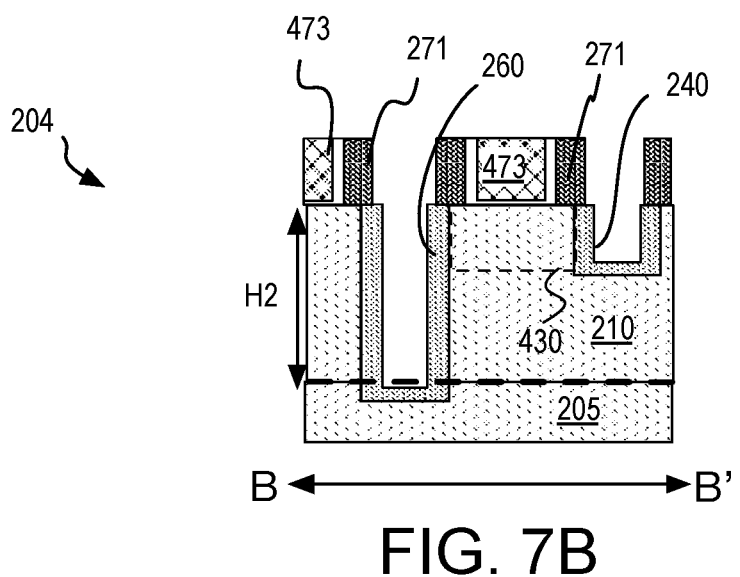
Figure 7C:
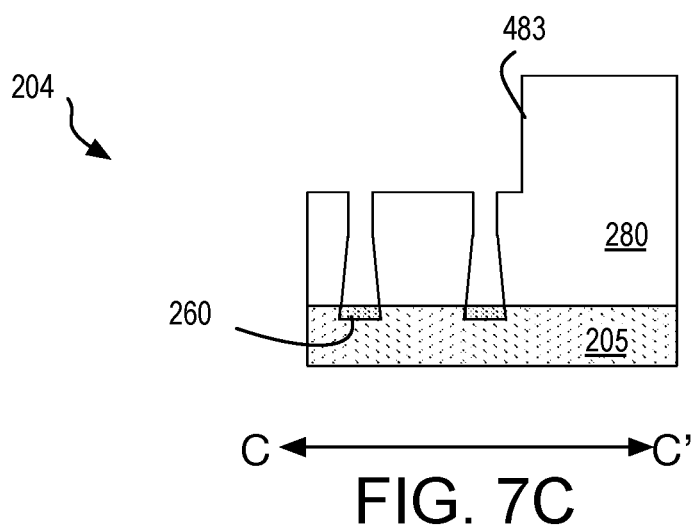

FIGS. 7A-7C further illustrate transistor cell 204 during the source/drain semiconductor deposition operation 330. As shown in FIGS. 7A and 7B, the channel region 430 remains protected by the channel mask (sacrificial gate electrode 473). Spacer dielectric 271 may also continue to protect a portion of channel region 430. Source/drain semiconductor 240 and deep source/drain semiconductor 260 begins to fill in the shallow and deep recesses, respectively, forming first on sidewalls of semiconductor bodies 210, as shown in FIG. 7B. In the plane depicted in FIG. 7C, source drain semiconductor 260 may form first at the bottom of the deep source/drain recess, for example as seeded by underlayer 205, and/or as the least shadowed surface of the recess.

Figure 8A:
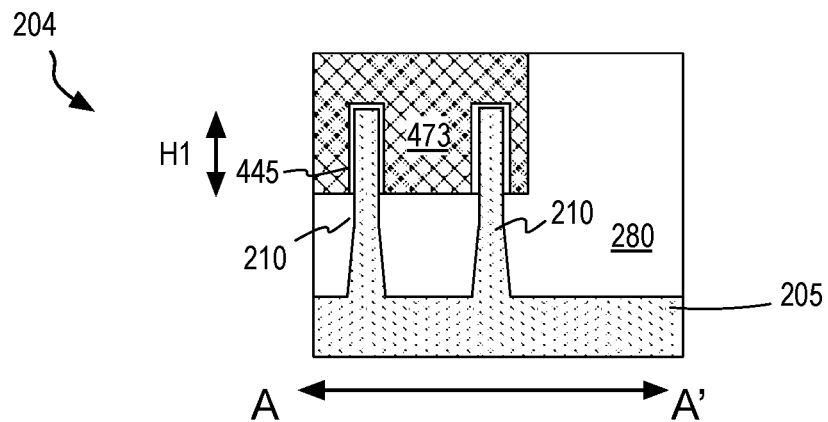
Figure 8B:
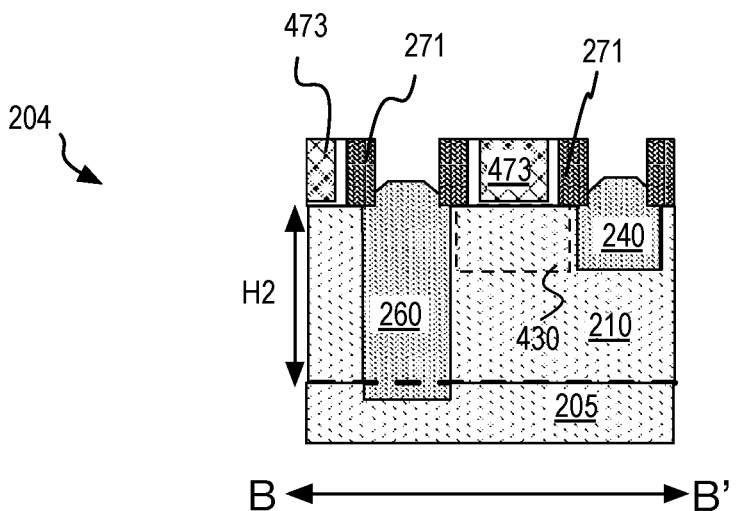
Figure 8C:
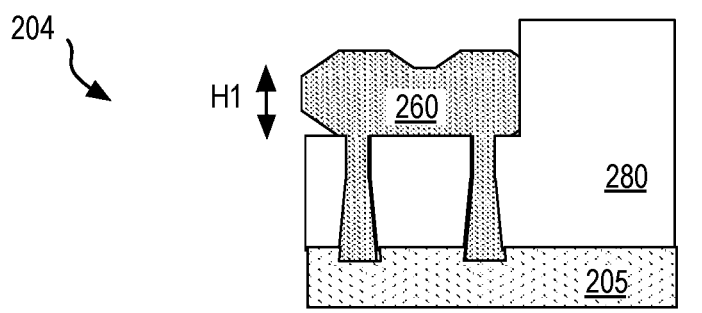

FIGS. 8A-8C further illustrate transistor cell 204 following the source/drain semiconductor deposition operation 330. As shown in FIG. 8B, shallow source/drain semiconductor 240 and deep source/drain semiconductor 260 have completely backfilled the shallow and deep source/drain recesses, respectively. As shown in FIG. 8C, deep source/drain semiconductor 260 bridges over isolation dielectric 280 that separates the two semiconductor bodies 210 (FIG. 8A). Hence, the source/drain semiconductor 260 extending down into underlayer 205 is electrically tied together at a common source/drain potential.

Figure 9A:
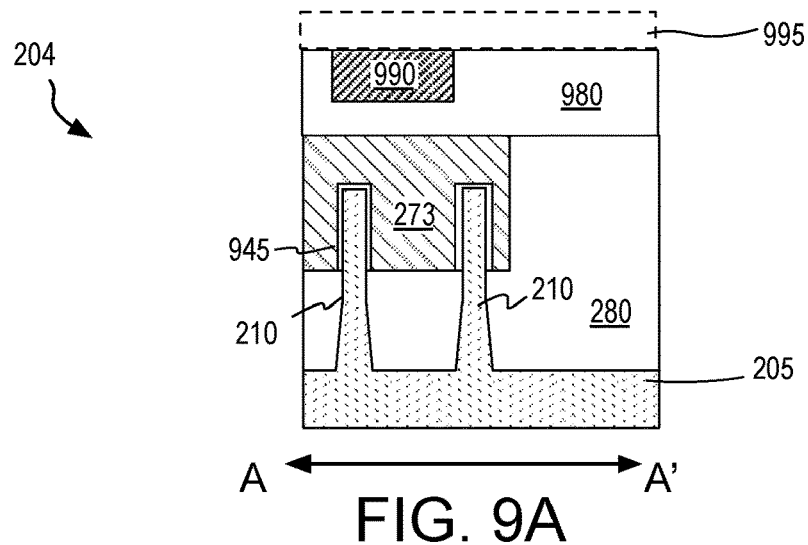
Figure 9B:
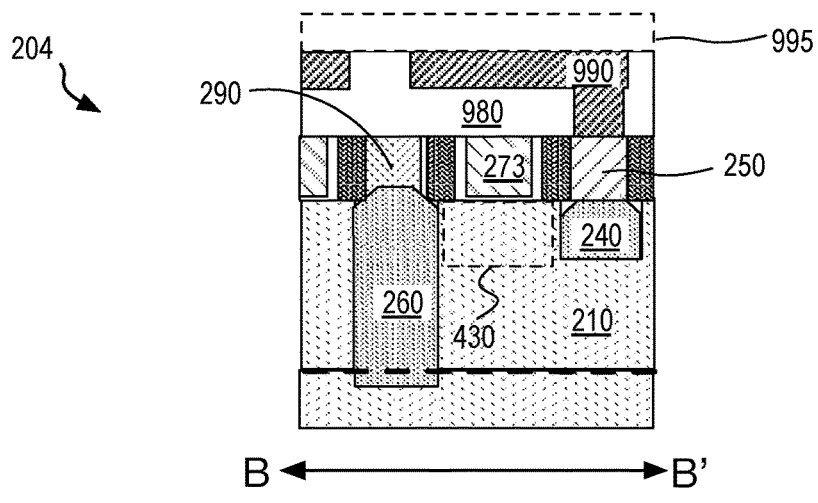

Returning to FIG. 3, methods 301 continue at operation 340 where a gate electrode and/or front-side terminal contacts, and/or front-side interconnect metallization levels are fabricated. In exemplary embodiments, both a gate electrode and one terminal contact to the shallow source/drain semiconductor is fabricated followed by one or more interconnect metallization levels. The deep source/drain semiconductor need not be contacted by a front-side metallization (contact metal or routing metal), affording more area to the other device terminals. For example, FIGS. 9A-9C further illustrate transistor cell 204 following front-side metallization operation 340. As shown in FIGS. 9A-9B, sacrificial gate 473 has been replaced with a final gate stack including a gate dielectric 945 (e.g., high-K material) and gate electrode 273 (e.g., metals). Any known gate replacement technique may be employed to form such structures.

Figure 9C:
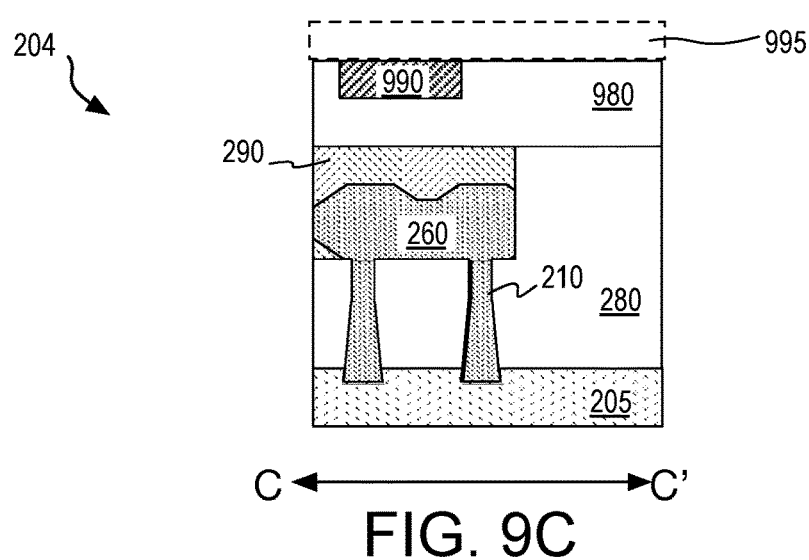

FIG. 9B also illustrates contact metallization 250 interfacing with shallow source/drain semiconductor 240. Contact metallization 250, as introduced in FIG. 2, is further illustrated as being interconnected with one or more circuit nodes by a first interconnect metallization level 990, embedded in an inter-level dielectric (ILD) 980. One or more additional front-side interconnect metallization levels may be formed over first interconnect metallization level 990, as represented in FIGS. 9A-9C by the dashed region 995. Any known contact fabrication, and/or (dual) damascene processing may be employed to form the illustrated structures. In the exemplary embodiment shown in FIG. 9B, deep source/drain semiconductor 260 is electrically isolated from overlying metallization levels by a dielectric cap 290, which is located where a conventional source/drain contact might be found. As such, first interconnect metallization level 990 connected to one source/drain terminal may extend over another source/drain terminal without shorting the transistor terminals. Dielectric cap 290 may have any composition, and may have the same or different composition as either of isolation dielectric 280 or ILD 980.

Figure 10A:
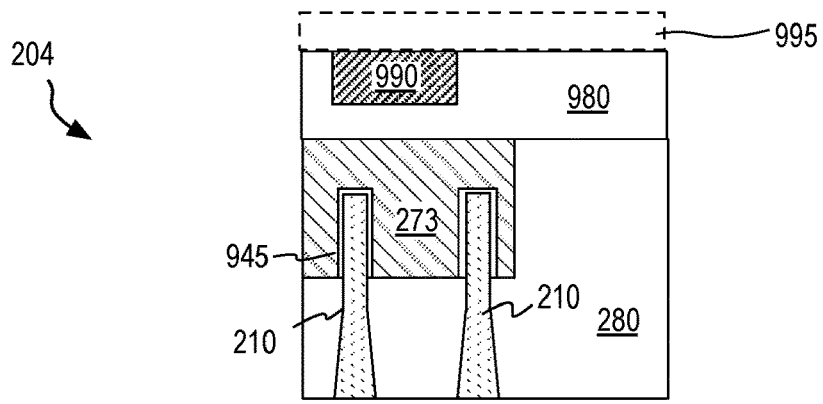
Figure 10B:
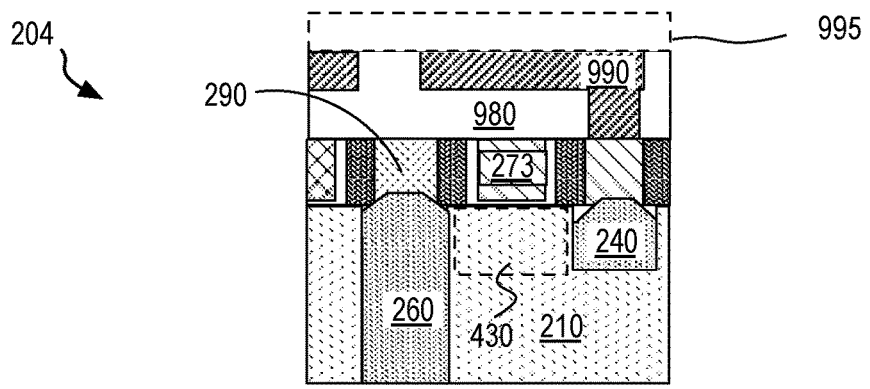
Figure 10C:
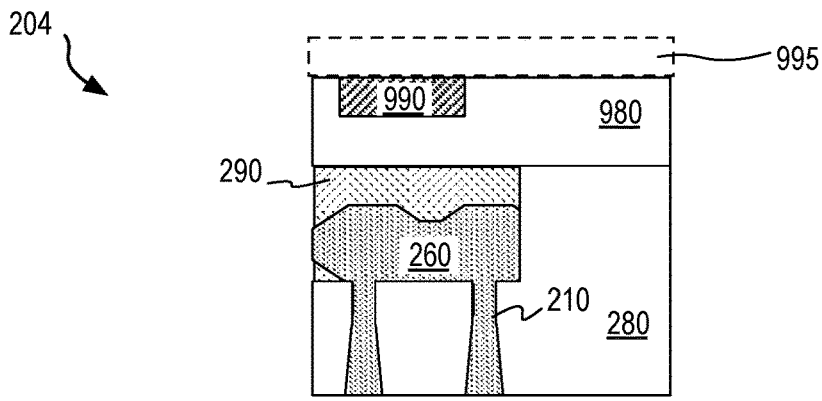

Returning to FIG. 3, methods 301 continue with back-side processing operation 150, which as described above in the context of FIG. 2, may entail removing at least a portion of the underlayer to reveal the deep source/drain semiconductor without exposing the shallow source/drain semiconductor. In some embodiments, where CMP is employed at operation 150, a back-side polish to remove the underlayer exposes a back-side surface of the non-planar semiconductor bodies. Where the deep source/drain semiconductor extends completely through the semiconductor body height, the back-side polish will also expose a bottom surface of the deep source/drain semiconductor. FIGS. 10A-10C, for example, further illustrate transistor cell 204 following a back-side process that removes underlayer 205, exposes a back-side surface of semiconductor bodies 210, opposite gate electrode 273, and also exposes a back-side surface of deep source/drain semiconductor 260, opposite dielectric cap 290.

Methods 301 complete at operation 170 where back-side contacts to the deep source/drain semiconductor are fabricated using any suitable materials (e.g., ohmic metals) and processing techniques. In some embodiments, the same contact metallization employed to interface with the shallow source/drain semiconductor on the transistor cell front side is employed to interface with the deep source/drain semiconductor on the transistor cell back side. In some further embodiments, one or more back-side interconnect metallization levels are fabricated to couple the deep source/drain semiconductor of multiple transistors together and/or to a common supply rail. Any metallization (e.g., Cu, Al, W, Ti, alloys thereof, etc.) and ILD material (e.g., SiOx, SiON, SiOC, other low-k materials, etc.) known to be suitable for front-side interconnect levels may be employed as back-side interconnect levels fabricated using any known techniques.

Figure 11A:
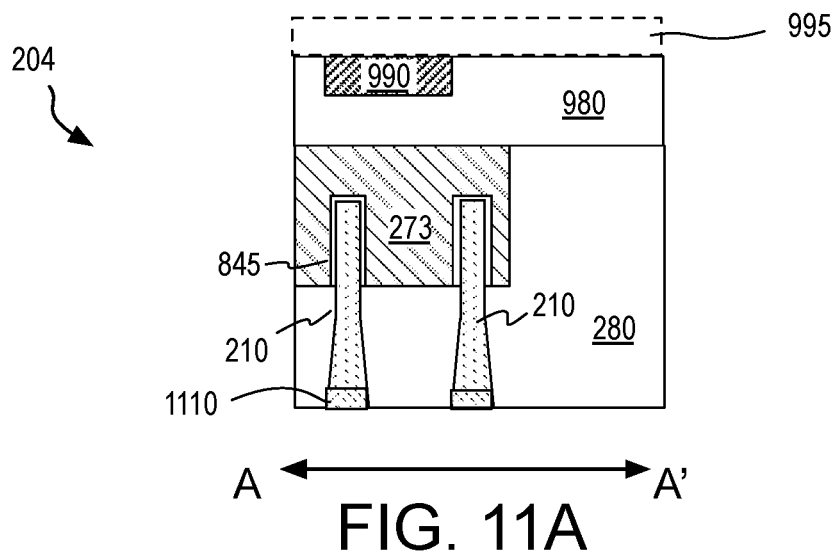
Figure 11B:
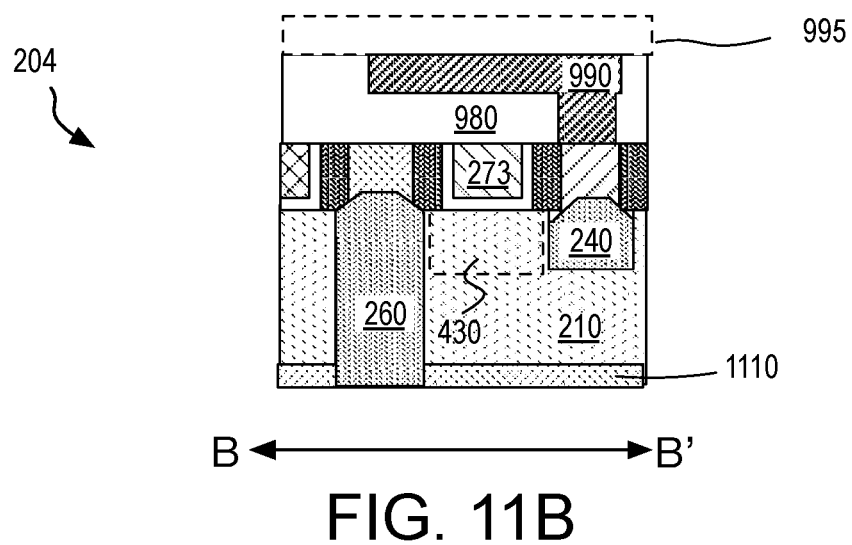
Figure 11C:
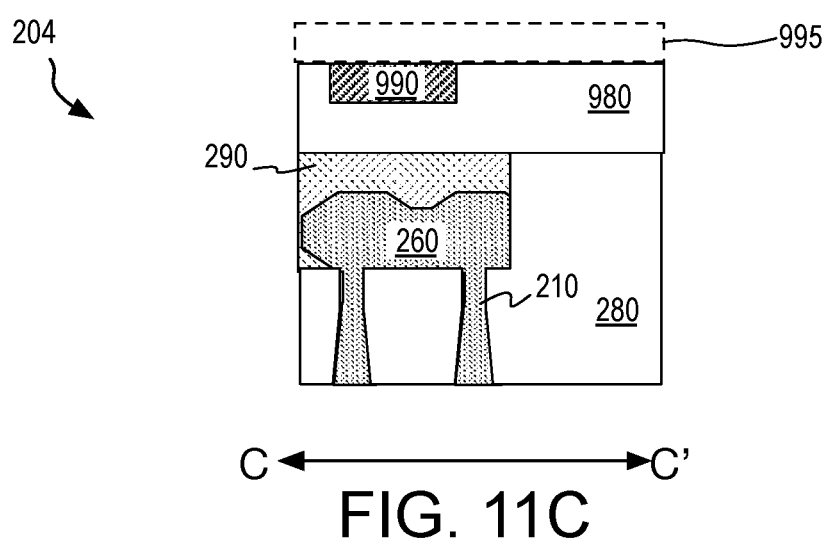
Figure 12A:
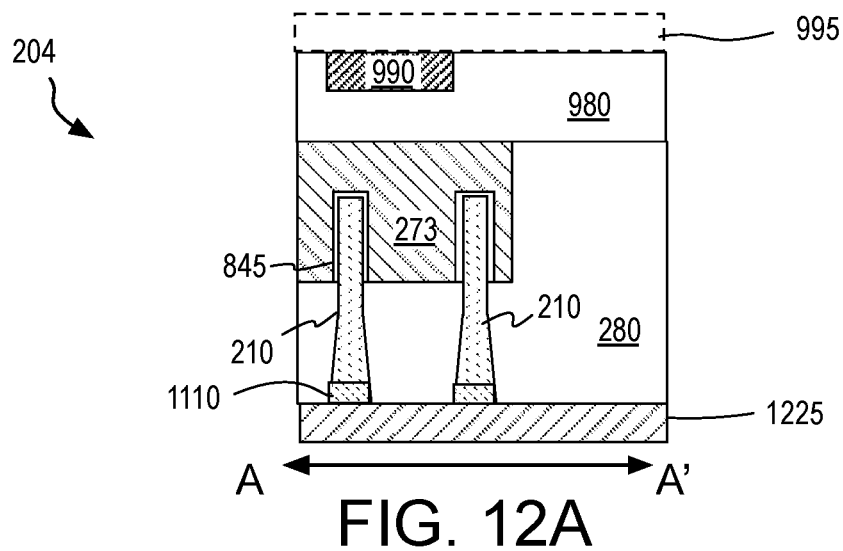
Figure 12B:
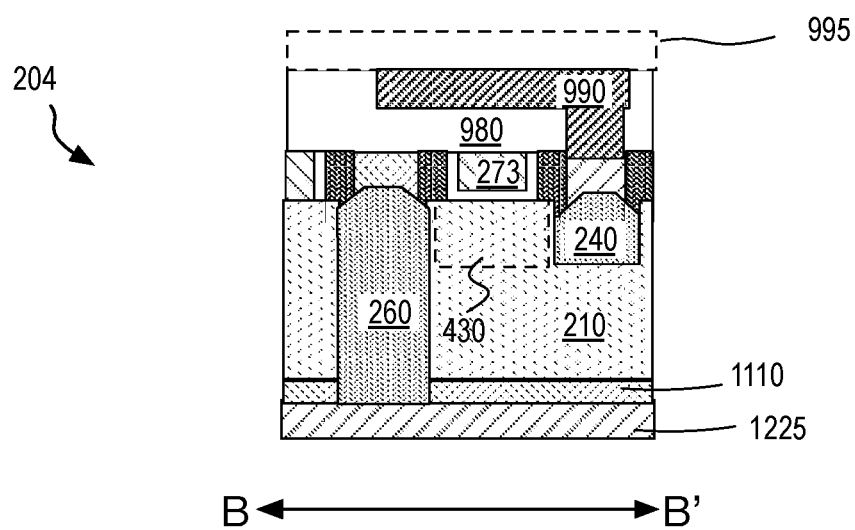
Figure 12C:
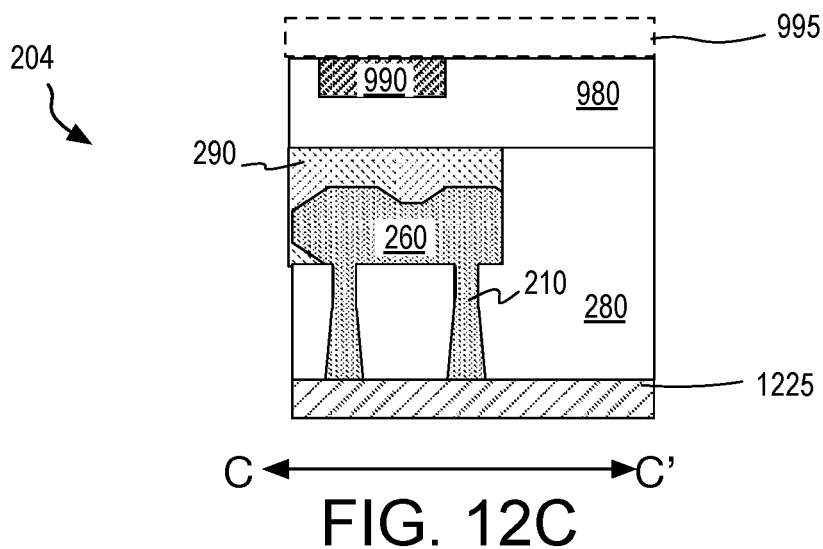

The electrical cross-section of the deep source/drain semiconductor may be approximately equal to the transverse width of the semiconductor body multiplied with the longitudinal length of the semiconductor body recessed at operations 315 and/or 325. Contact resistance associated with the interface between the back-side metallization and deep source/drain semiconductor may be lowered by doping the revealed back-side of the semiconductor bodies. FIGS. 11A-11C, for example, further illustrate transistor cell 204 following a back-side impurity doping process during which an impurity-doped semiconductor region 1110 is formed on the backside of a semiconductor body. As shown, impurity-doped semiconductor region 1110 intersects deep source/drain 260. Impurity-doped semiconductor region 1110 may have any thickness limited by the semiconductor body (fin) height, the depth of channel region 430, and associated parasitic capacitances. Impurity-doped semiconductor region 1110 may be doped to have a p-type or n-type conductivity. The impurity concentration may be significantly greater (e.g., at least an order of magnitude) than that of the remainder of the semiconductor body. In some embodiments, impurity-doped semiconductor region 1110 is doped to the same conductivity type as that of deep source/drain 260 (e.g., n-type for and NMOS transistor). Doping may be achieved with any impurity (e.g., As or B) to a desired concentration using any techniques, such as, but not limited to, ion implantation and anneal, or solid state diffusion.

Figure 13A:
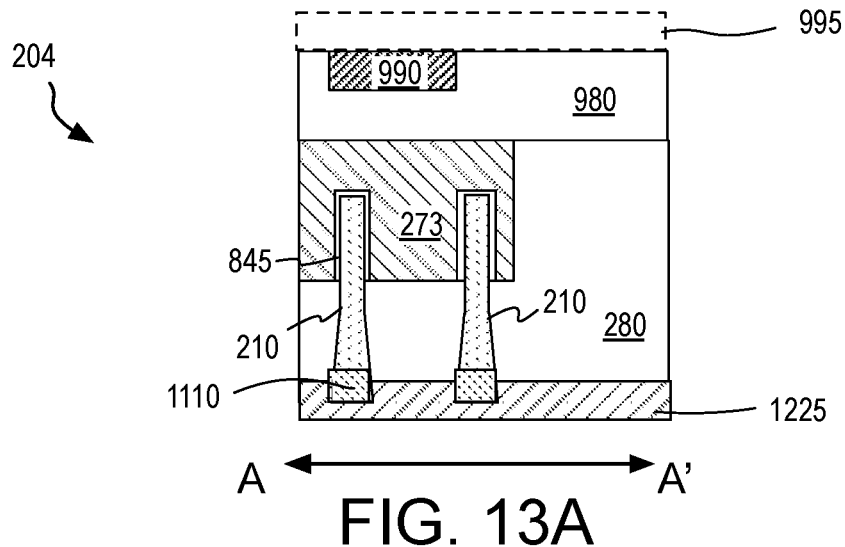
Figure 13B:
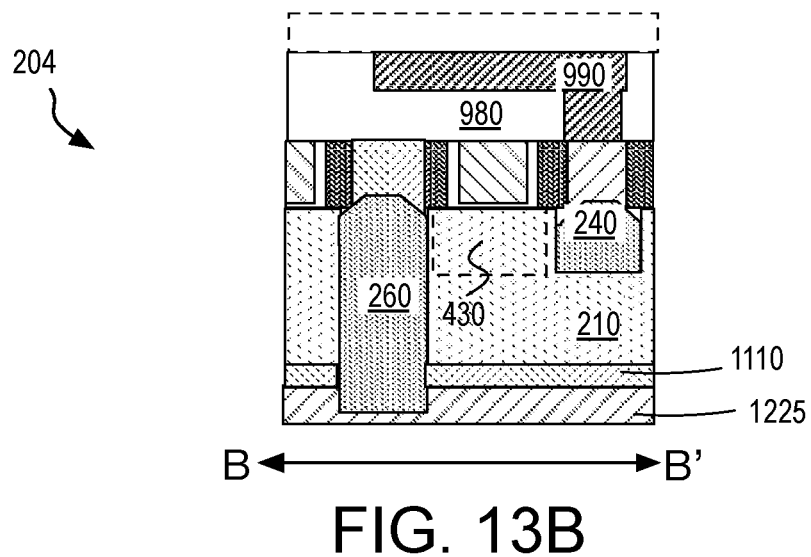
Figure 13C:
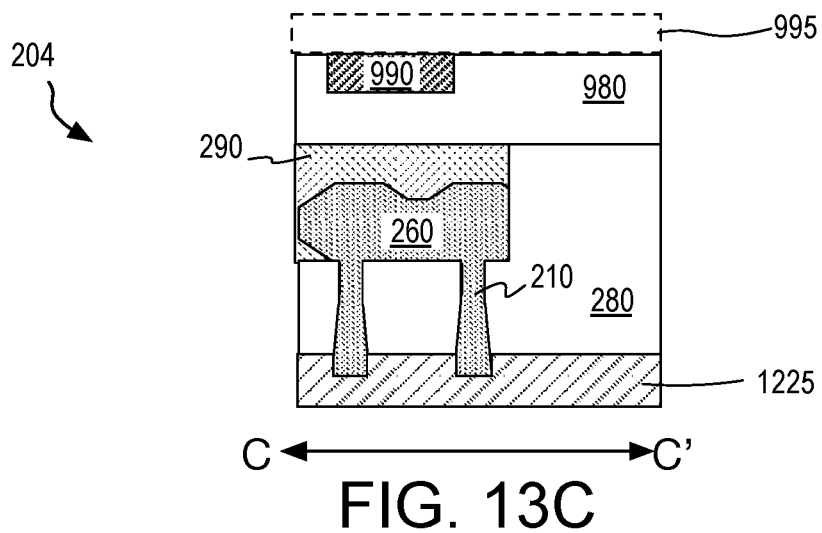

FIGS. 12A-12C and FIGS. 13A-13C further illustrate transistor cell 204 following fabrication of a first back-side metallization level 1225 that contacts deep source/drain 260. In the embodiments represented by FIGS. 12A-12C, back-side metallization level 1225 is disposed on a planar surface comprising deep source/drain 260, impurity-doped semiconductor region 1110, and isolation 210. The larger metal interface surface area afforded by impurity-doped semiconductor region 1110 is evident in FIG. 12B. Deep source/drain semiconductor contact resistance may also be reduced by recessing the back-side surface of any dielectric surrounding the deep source/drain semiconductor and/or semiconductor body. In the embodiments illustrated by FIGS. 13A-13C, isolation dielectric 280 has been recessed from the back-side surface of semiconductor bodies 210 (e.g., witch any wet chemical or dry plasma etch) selective to the isolation dielectric composition relative to the semiconductor. The resulting sidewall surfaces of impurity-doped semiconductor region 1110 are shown in FIG. 13A. The recess etch will also expose sidewall surfaces of deep source/drain semiconductor 260, as shown in FIGS. 13B-13C. Once exposed, back-side metallization level 1225 may be deposited to contact the exposed sidewall surfaces of deep source/drain semiconductor 260 and/or doped semiconductor region 1110, thereby increasing contact surface area relative to planar contact embodiments.

Figure 14:
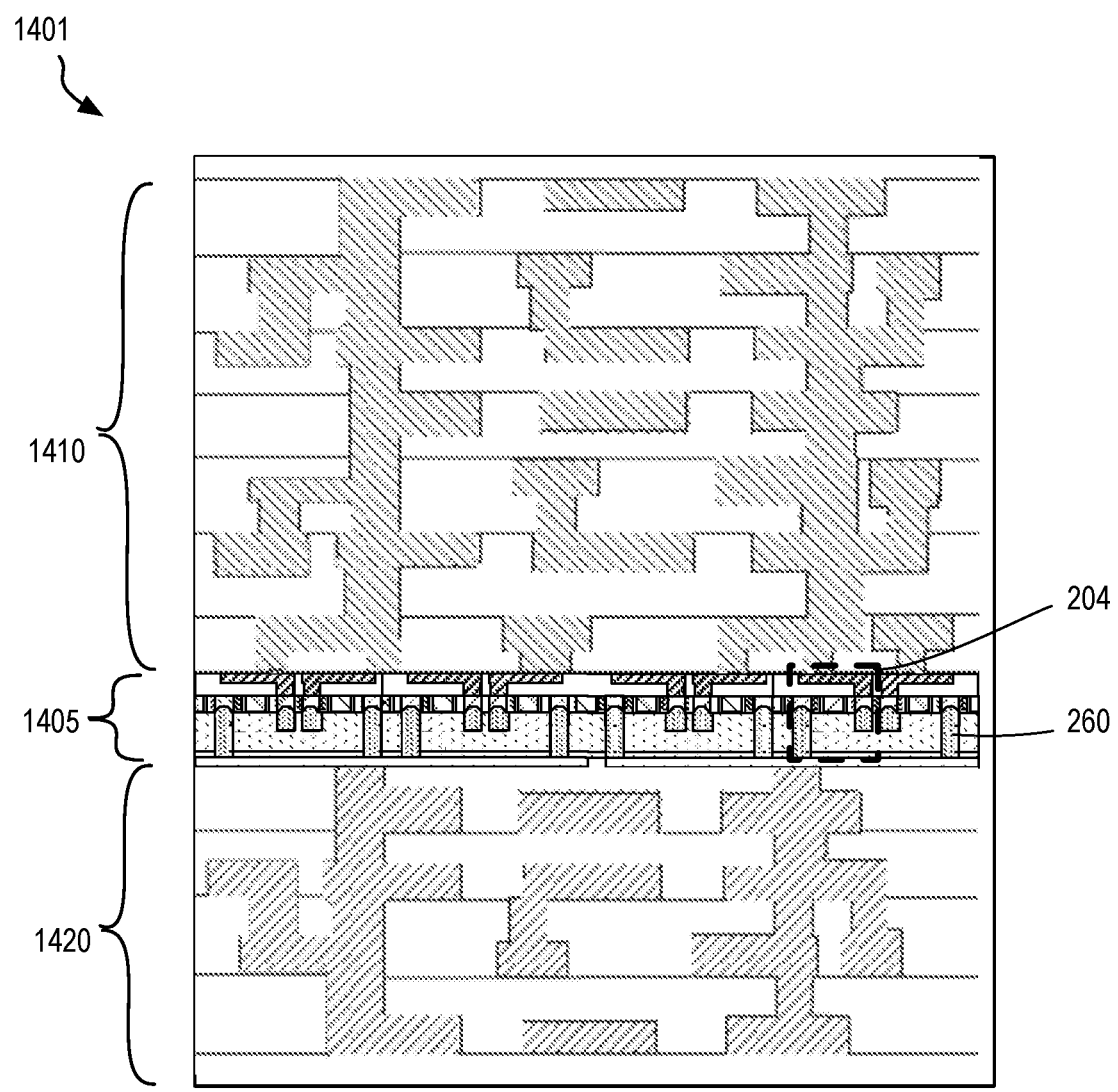
FIG. 14 is a cross-sectional view of an integrated circuit device including a transistor stratum with through source/drain semiconductor and that is interconnected with front-side and back-side interconnect metallization levels, in accordance with some embodiments.

FIG. 14 is a cross-sectional view of an integrated circuit (IC) device 1401 with a transistor stratum 1405 including a deep source/drain semiconductor 260 interconnected with front-side interconnect metallization levels 1410 and back-side interconnect metallization levels 1420, in accordance with some embodiments. IC device 1401 may be any ASIC or purpose-built device including CMOS logic transistors, such as, but not limited to, a microprocessor, a memory (and/or memory controller), or FPGA. As shown, transistor stratum 1405 includes a plurality of transistor cells 204, each including a deep source/drain semiconductor 260 extending through the semiconductor device layer (e.g. a "through-fin" source/drain semiconductor) that couples to back-side interconnect metallization levels 1420. Other terminals of transistor cells 204 (e.g., gate and shallow source/drain semiconductor) coupled to front-side interconnect metallization levels 1410.

Figure 15:
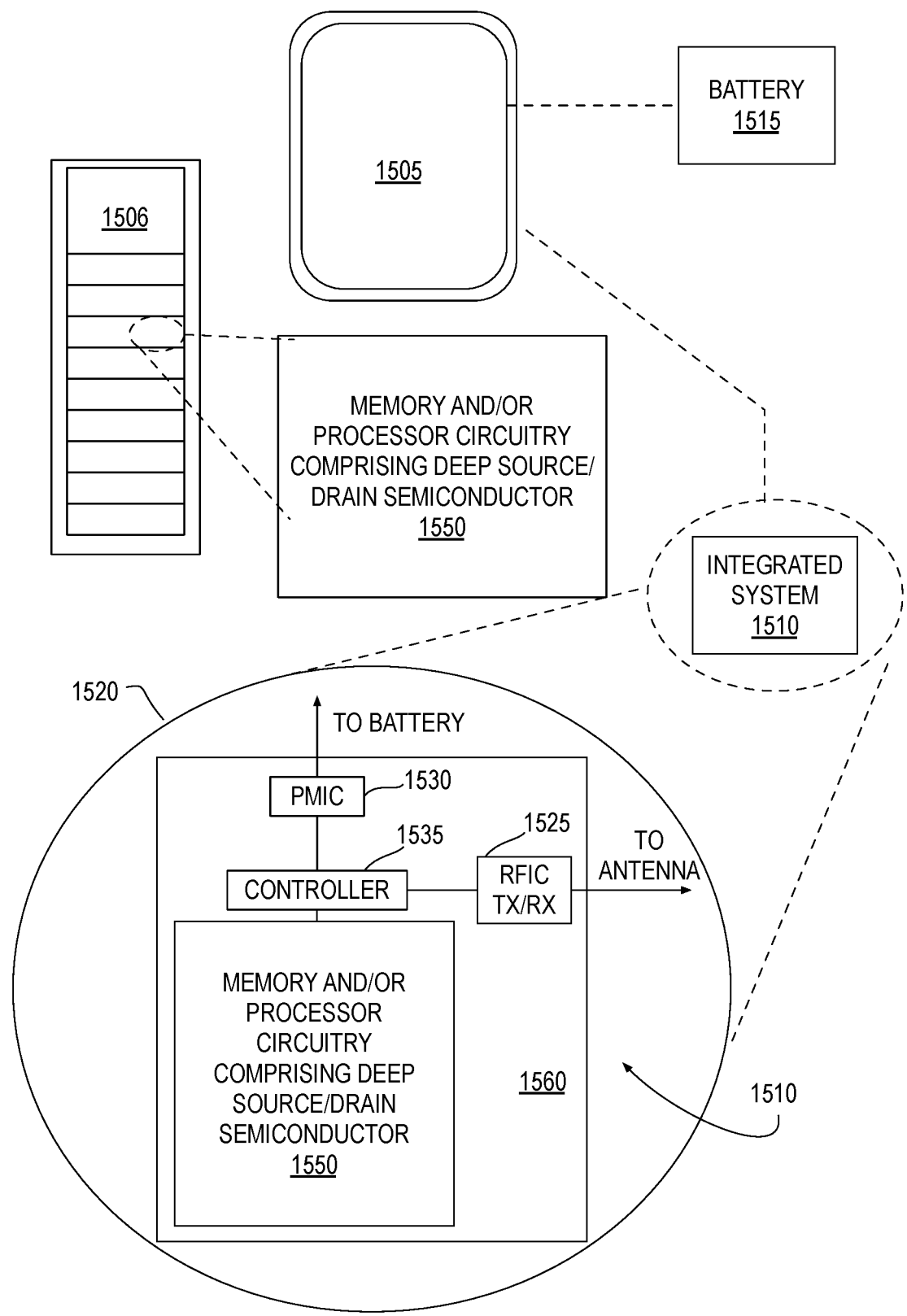
FIG. 15 illustrates a mobile computing platform and a data server machine employing an SoC having a plurality of FETs including deep source/drain semiconductor and back-side interconnects, in accordance with embodiments.

FIG. 15 illustrates a mobile computing platform and a data server machine employing an IC including transistor cells having a deep source/drain semiconductor extending through the semiconductor device layer, for example in accordance with embodiments described elsewhere herein. The server machine 1506 may be any commercial server, for example including any number of high-performance computing platforms disposed within a rack and networked together for electronic data processing, which in the exemplary embodiment includes a packaged monolithic SoC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Either disposed within the integrated system 1510 illustrated in the expanded view 1520, or as a stand-alone packaged chip within the server machine 1506, monolithic SoC 1550 includes a processor block (e.g., a microprocessor, a multi-core microprocessor, graphics processor, or the like) having a deep source/drain semiconductor extending through the semiconductor device layer, for example in accordance with embodiments described elsewhere herein. The monolithic SoC 1550 may be further coupled to a board, a substrate, or an interposer 1560 along with, one or more of a power management integrated circuit (PMIC) 1530, RF (wireless) integrated circuit (RFIC) 1525 including a wideband RF (wireless) transmitter and/or receiver (TX/RX) (e.g., including a digital baseband and an analog front end module further comprises a power amplifier on a transmit path and a low noise amplifier on a receive path), and a controller 1535. Any or all of RFIC 1525 and PMIC 1530 may also include transistors with a deep source/drain semiconductor extending through a semiconductor device layer, for example in accordance with embodiments described elsewhere herein.

Functionally, PMIC 1530 may perform battery power regulation, DC-to-DC conversion, etc., and so has an input coupled to battery 1515 and with an output providing a current supply to other functional modules. As further illustrated, in the exemplary embodiment, RFIC 1525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1550.

Figure 16:
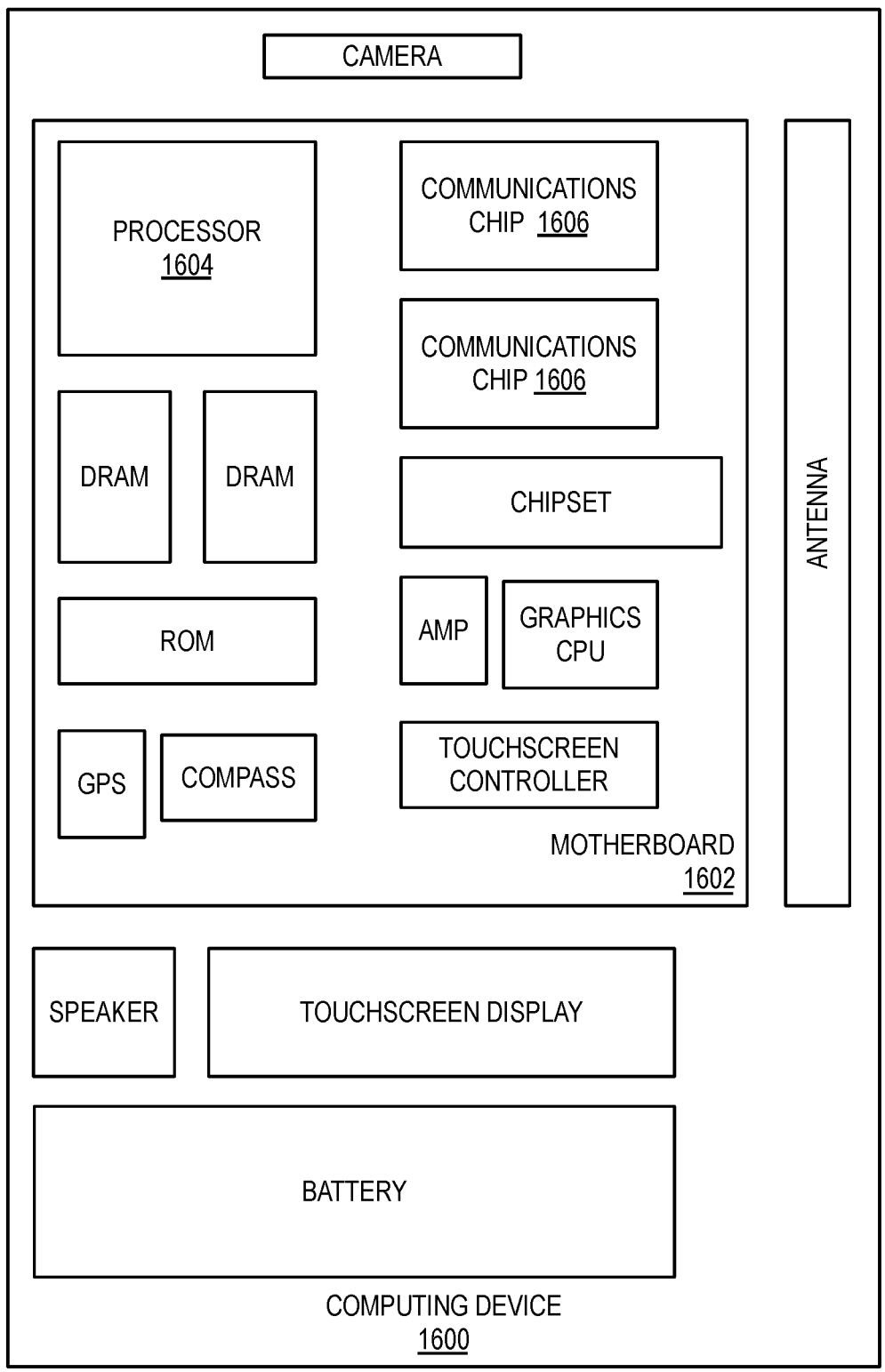
FIG. 16 is a functional block diagram of an electronic computing device, in accordance with some embodiments.

FIG. 16 is a functional block diagram of an electronic computing device, in accordance with some embodiments. Computing device 1600 may be found inside platform 1605 or server machine 1606, for example. Device 1600 further includes a motherboard 1602 hosting a number of components, such as, but not limited to, a processor 1604 (e.g., an applications processor), which may further incorporate transistors with a deep source/drain semiconductor extending through a semiconductor device layer, for example in accordance with embodiments described herein. Processor 1604 may be physically and/or electrically coupled to motherboard 1602. In some examples, processor 1604 includes an integrated circuit die packaged within the processor 1604. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. For example the above embodiments may include specific combinations of features as further provided below.

In one or more first examples, a transistor cell comprises a semiconductor body extending through an isolation dielectric, a gate electrode disposed over a channel region of the semiconductor body extending beyond a front side of the isolation dielectric, and semiconductor source/drain regions electrically coupled to the channel region. The semiconductor source/drain regions include at least one deep source/drain region extending to a depth below that of the channel region. The transistor cell further comprises one or more front-side interconnect metallization levels disposed over the front side of the isolation dielectric and coupled to at least one of the source/drain regions or the gate electrode, and the transistor cell comprises one or more back-side interconnect metallization levels disposed over a back side of the isolation dielectric and electrically coupled the deep source/drain region.

In one or more second examples, for the transistor cell in any of the first examples the source/drain regions include a shallow source/drain region extending to a depth less than that of the deep source/drain region. The front-side interconnect metallization levels are coupled to the shallow source/drain region and the gate electrode.

In one or more third examples, for the transistor cell in any of the first or second examples, the shallow source/drain region extends to a depth approximately equal to that of the channel region.

In one or more fourth examples, for the transistor cell in any of the first, second, or third examples, a first of the front-side interconnect metallization levels is coupled to the shallow source/drain region and extends over a dielectric material covering a front side of the deep source/drain semiconductor.

In one or more fifth examples, for the transistor cell in any of the first, second, third or fourth examples, the deep source/drain region extends through the entire height of the semiconductor body, to a depth at least equal to that of the isolation dielectric.

In one or more sixth examples, for the transistor cell in any of the fifth examples, a base of the non-planar semiconductor body has the same conductivity type as the deep source/drain region, and the back-side interconnect metallization level electrically coupled to the deep source/drain region makes contact to the impurity-doped base of the non-planar semiconductor body.

In one or more seventh examples, for the transistor cell in any of the fifth examples, a back-side surface of the isolation dielectric is recessed from the deep source/drain region, and the back-side interconnect metallization level electrically coupled the deep source/drain region makes electrical contact through sidewalls of the deep source/drain region.

In one or more eighth examples, for the transistor cell in any of the first, second, third, fourth, fifth, sixth, or seventh embodiments, the non-planar semiconductor body includes at least a pair of semiconductor fins having a same fin height and separated by intervening isolation dielectric. The gate electrode includes a single gate electrode disposed over a channel region in each of the pair of semiconductor fins and extending over the intervening isolation dielectric. The deep source/drain region has a deep source/drain height that is at least equal to the fin height, and includes at least a pair of p-type or n-type semiconductor fins separated by the intervening isolation dielectric within at least a first portion of the deep source/drain height.

In one or more ninth examples, for the transistor cell in any of the eighth examples the pair of p-type or n-type semiconductor fins are interconnected by a bridge of p-type or n-type semiconductor comprising a second portion of the deep source/drain height and extending over the intervening isolation dielectric.

In one or more tenth examples, a microprocessor includes one or more logic cores, wherein the logic cores includes the transistor cell in any of the first, second, third, fourth, fifth, sixth, seventh, eighth, or ninth examples.

In one or more eleventh examples, a method of fabricating a transistor includes receiving a substrate including a semiconductor body extending through an isolation dielectric and disposed over an underlayer. The method includes forming a gate electrode over a channel region of the semiconductor body extending beyond a front side of the isolation dielectric. The method includes etching a recess in the semiconductor body at a source/drain location adjacent to the channel region and to a depth below that of the channel region. The method includes backfilling the recess with source/drain semiconductor. The method includes forming a front-side interconnect metallization level over the front side of the isolation dielectric and coupled to a source/drain region or the gate electrode. The method includes removing at least a portion of the underlayer to reveal the backfilled source/drain semiconductor. The method includes forming a back-side interconnect metallization level over a back side of the isolation dielectric, and electrically coupled the revealed source/drain semiconductor.

In one or more twelfth examples, for the method in any of the eleventh examples, etching the recess further comprises forming a channel mask over the semiconductor body, etching a shallow source/drain recess on a first side of the channel mask to a first depth, and etching a deep source/drain recess on a second side of the channel mask to a second depth, greater than the first depth.

In one or more thirteenth examples, for the method in any of the twelfth examples, backfilling the recess with source/drain semiconductor further comprises depositing source/drain semiconductor within the shallow and deep source/drain recesses. Removing at least a portion of the underlayer to reveal the backfilled source/drain semiconductor further comprises revealing the deep source/drain semiconductor without revealing the shallow source/drain semiconductor.

In one or more fourteenth examples, for the method in any of the twelfth examples, etching the shallow source/drain recess further comprises recessing, to the first depth, the isolation dielectric surrounding the semiconductor body at a first source/drain location, and etching the semiconductor body exposed within the isolation dielectric recess. Etching the deep source/drain recess further comprises recessing, to the first depth, the isolation dielectric surrounding the semiconductor body at a second source/drain location, etching the semiconductor body exposed within the isolation dielectric recess until the semiconductor body is recessed to the second depth below the isolation dielectric recess.

In one or more fifteenth examples, for the method in any of the fourteenth examples depositing source/drain semiconductor within the shallow and deep source/drain recesses further comprises backfilling the semiconductor body recess and isolation dielectric recess with the source/drain semiconductor.

In one or more sixteenth examples, for the method in any of the twelfth, thirteenth, fourteenth or fifteenth examples, the first depth is approximately equal to that of the channel region.

In one or more seventeenth examples, for the method in any of the twelfth, thirteenth, fourteenth, fifteenth, or sixteenth examples the second depth intersects the underlayer.

In one or more eighteenth examples, for the method in any of the eleventh, twelfth, thirteenth, fourteenth, fifteenth, sixteenth, or seventeenth examples forming the front-side interconnect metallization further comprises forming an interconnect metallization coupled to the shallow source/drain semiconductor and extending over a dielectric material covering a front side of the deep source/drain semiconductor.

In one or more nineteenth examples, for the method in any of the eleventh, twelfth, thirteenth, fourteenth, fifteenth, sixteenth, seventeenth or eighteenth examples the method further includes doping a base of the non-planar semiconductor body to a same conductivity type as the deep source/drain region after revealing the deep source/drain semiconductor. Forming the one or more front-side interconnect metallization further comprises forming an interconnect metallization level in contact with the impurity-doped base of the non-planar semiconductor body.

In one or more twentieth examples, for the method in any of the eleventh, twelfth, thirteenth, fourteenth, fifteenth, sixteenth, seventeenth, eighteenth, or nineteenth examples forming the one or more front-side interconnect metallization further comprises recessing a back side of the isolation dielectric from the deep source/drain semiconductor, and depositing a metal on exposed sidewalls of the deep source/drain semiconductor.

It will be recognized that principles of the disclosure are not limited to the embodiments so described, but can be practiced with modification and alteration without departing from the scope of the appended claims. For example the above embodiments may include specific combinations of features as further provided below.

What is claimed is:

1. A transistor structure, comprising:
   a semiconductor body extending through an isolation dielectric;
   a gate electrode over a channel region of the semiconductor body and extending over a front side of the isolation dielectric;
   source and drain regions comprising semiconductor material electrically coupled to the channel region, wherein the source and drain regions include at least one deep source or deep drain region extending to a depth below that of the channel region;
   one or more front-side interconnect metallization levels over the front side of the isolation dielectric, and coupled to at least one of the source and drain regions, or to the gate electrode; and
   one or more back-side interconnect metallization levels over a back side of the isolation dielectric and electrically coupled to the deep source or deep drain region.

2. The transistor structure of claim 1, wherein:
   the source and drain regions include a shallow source or shallow drain region extending to a depth less than that of the deep source or deep drain region; and
   the front-side interconnect metallization levels are coupled to the shallow source or shallow drain region, and to the gate electrode.

3. The transistor structure of claim 2, wherein the shallow source or shallow drain region extends to a depth approximately equal to that of the channel region.

4. The transistor structure of claim 2, wherein a first of the front-side interconnect metallization levels is coupled to the shallow source or shallow drain region and extends over a dielectric material covering a front side of the deep source or deep drain region.

5. The transistor structure of claim 1, wherein the deep source or deep drain region extends through the entire height of the semiconductor body, to a depth at least equal to that of the isolation dielectric.

6. The transistor structure of claim 5, wherein:
a base of the non-planar semiconductor body has the same conductivity type as the deep source or deep drain region; and
the back-side interconnect metallization level electrically coupled to the deep source or deep drain region makes contact to the base of the non-planar semiconductor body.

7. The transistor structure of claim 5, wherein:
a back-side surface of the isolation dielectric is recessed from the deep source or deep drain region; and
the back-side interconnect metallization level electrically coupled the deep source or deep drain region makes electrical contact through a sidewall of the deep source or deep drain region.

8. The transistor structure of claim 1, wherein:
the non-planar semiconductor body includes at least a pair of semiconductor fins having a same fin height and separated by intervening isolation dielectric;
the gate electrode includes a single gate electrode over a channel region in each of the pair of semiconductor fins and extending over the intervening isolation dielectric; and
the deep source or deep drain region has a deep source or deep drain height that is at least equal to the fin height, and includes at least a pair of p-type or n-type semiconductor fins separated by the intervening isolation dielectric within at least a first portion of the deep source or deep drain height.

9. The transistor structure of claim 8, wherein the pair of p-type or n-type semiconductor fins are interconnected by a bridge of p-type or n-type semiconductor comprising a second portion of the deep source or deep drain height, and extending over the intervening isolation dielectric.

10. A microprocessor including one or more logic cores, wherein the logic cores include one or more transistor structure as recited in claim 1.

11. A method of fabricating a transistor structure, the method comprising:
receiving a substrate including a semiconductor body extending through an isolation dielectric, and over an underlayer;
forming a gate electrode over a channel region of the semiconductor body, the gate electrode extending over a front side of the isolation dielectric;
etching a recess in the semiconductor body at a source or drain location adjacent to the channel region and to a depth below that of the channel region;
backfilling the recess with a source or drain semiconductor material;
forming a front-side interconnect metallization level over the front side of the isolation dielectric and coupled to a source or drain, or to the gate electrode;
removing at least a portion of the underlayer to reveal the backfilled source or drain semiconductor material; and
forming a back-side interconnect metallization level over a back side of the isolation dielectric, and electrically coupled the source or drain semiconductor material.

12. The method of claim 11, wherein etching the recess further comprises:

forming a channel mask over the semiconductor body;
etching a shallow source or shallow drain recess on a first side of the channel mask to a first depth; and
etching a deep source or deep drain recess on a second side of the channel mask to a second depth, greater than the first depth.

13. The method of claim 12, wherein:
backfilling the recess with source or drain semiconductor material further comprises depositing source or drain semiconductor material within both the shallow and deep source or drain recesses; and
removing at least a portion of the underlayer to reveal the backfilled source or drain semiconductor material further comprises revealing the deep source or deep drain semiconductor material without revealing the shallow source or shallow drain semiconductor material.

14. The method of claim 12, wherein:
etching the shallow source or shallow drain recess further comprises:
recessing, to the first depth, the isolation dielectric surrounding the semiconductor body at a first source or drain location; and
etching the semiconductor body exposed within the isolation dielectric recess; and
etching the deep source or deep drain recess further comprises:
recessing, to the first depth, the isolation dielectric surrounding the semiconductor body at a second source or drain location; and
etching the semiconductor body exposed within the isolation dielectric recess until the semiconductor body is recessed to the second depth below the isolation dielectric recess.

15. The method of claim 14, wherein depositing source or drain semiconductor material within the shallow and deep source or drain recesses further comprises backfilling the semiconductor body recess and isolation dielectric recess with the source or drain semiconductor material.

16. The method of claim 12, wherein the first depth is approximately equal to that of the channel region.

17. The method of claim 12, wherein the second depth intersects the underlayer.

18. The method of claim 11, wherein:
forming the front-side interconnect metallization further comprises forming an interconnect metallization coupled to the shallow source or shallow drain semiconductor material, and extended over a dielectric material covering a front side of the deep source or deep drain semiconductor material.

19. The method of claim 11, further comprising:
doping a base of the non-planar semiconductor body to a same conductivity type as the deep source or deep drain region after revealing the deep source or deep drain semiconductor material; and
forming the one or more front-side interconnect metallization further comprises forming an interconnect metallization level in contact with the impurity-doped base of the non-planar semiconductor body.

20. The method of claim 11, wherein forming the one or more front-side interconnect metallization further comprises:
recessing a back side of the isolation dielectric from the deep source or deep drain semiconductor material; and
depositing a metal on exposed sidewalls of the deep source or deep drain semiconductor material.

* * * * *